(12) United States Patent
Yoshida

(10) Patent No.: US 11,873,578 B2
(45) Date of Patent: Jan. 16, 2024

(54) METHOD FOR MANUFACTURING NITRIDE SEMICONDUCTOR SUBSTRATE AND NITRIDE SEMICONDUCTOR SUBSTRATE

(71) Applicant: SUMITOMO CHEMICAL COMPANY, LIMITED, Tokyo (JP)

(72) Inventor: Takehiro Yoshida, Hitachi (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 354 days.

(21) Appl. No.: 17/312,617

(22) PCT Filed: Nov. 29, 2019

(86) PCT No.: PCT/JP2019/046702
§ 371 (c)(1),
(2) Date: Jun. 10, 2021

(87) PCT Pub. No.: WO2020/121837
PCT Pub. Date: Jun. 18, 2020

(65) Prior Publication Data
US 2022/0074071 A1    Mar. 10, 2022

(30) Foreign Application Priority Data

Dec. 14, 2018   (JP) .................................. 2018-234345
Mar. 28, 2019   (JP) .................................. 2019-063184

(51) Int. Cl.
*C23C 16/01*      (2006.01)
*C30B 29/40*      (2006.01)
(Continued)

(52) U.S. Cl.
CPC ............ *C30B 29/403* (2013.01); *C23C 16/01* (2013.01); *C23C 16/0272* (2013.01);
(Continued)

(58) Field of Classification Search
CPC ... C23C 16/01; C23C 16/0272; C23C 16/303; C30B 25/183; C30B 29/403;
(Continued)

(56) References Cited

U.S. PATENT DOCUMENTS 6,468,347 B1    10/2002   Motoki et al.
2003/0145783 A1  8/2003   Motoki et al.
(Continued)

FOREIGN PATENT DOCUMENTS

JP   2001-102307 A    4/2001
JP   2003-183100 A    7/2003
(Continued)

OTHER PUBLICATIONS

International Searching Authority, "International Search Report," issued in connection with International Patent Application No. PCT/JP2019/046702, dated Feb. 4, 2020.
(Continued)

*Primary Examiner* — Lawrence D Ferguson
(74) *Attorney, Agent, or Firm* — Foley & Lardner LLP

(57) ABSTRACT

A method for manufacturing a nitride semiconductor substrate by using a vapor phase growth method includes: a step of preparing a base substrate that is constituted by a material different from a single crystal of a group III nitride semiconductor; a step of growing a base layer on the upper side of the base substrate; a first step of growing a first layer by epitaxially growing a single crystal of a group III nitride semiconductor directly on the base surface of the base layer, the single crystal of the group III nitride semiconductor having a top surface at which a (0001) plane is exposed, and a plurality of recessed portions formed by inclined interfaces other than the (0001) plane being generated in the top surface; and a second step of growing a second layer that has a mirror-finished surface.

15 Claims, 15 Drawing Sheets

(51) Int. Cl.
  *C23C 16/02* (2006.01)
  *C23C 16/30* (2006.01)
  *C30B 25/18* (2006.01)
  *H01L 21/02* (2006.01)

(52) U.S. Cl.
  CPC .......... *C23C 16/303* (2013.01); *C30B 25/183* (2013.01); *H01L 21/0254* (2013.01); *H01L 21/0262* (2013.01); *H01L 21/02458* (2013.01); *H01L 21/02502* (2013.01); *H01L 21/02505* (2013.01); *H01L 21/02513* (2013.01); *H01L 21/02598* (2013.01); *H01L 21/0242* (2013.01)

(58) Field of Classification Search
  CPC ................ C30B 25/02; H01L 21/0242; H01L 21/02458; H01L 21/02502; H01L 21/02505; H01L 21/02513; H01L 21/0254; H01L 21/02598; H01L 21/0262; H01L 21/0243; H01L 21/02433; H01L 21/02516; H01L 21/02576
  See application file for complete search history.

(56) References Cited

U.S. PATENT DOCUMENTS

| 2005/0076828 A1 | 4/2005 | Taki et al. |
| 2010/0275836 A1 | 11/2010 | Sato et al. |
| 2018/0174911 A1 | 6/2018 | Komatsu et al. |

FOREIGN PATENT DOCUMENTS

| JP | 2005-072310 A | 3/2005 |
| JP | 2009-167053 A | 7/2009 |
| JP | 2013-214686 A | 10/2013 |
| JP | 2017-226584 A | 12/2017 |
| JP | 2018-095545 A | 6/2018 |

OTHER PUBLICATIONS

International Searching Authority, "Written Opinion," issued in connection with International Patent Application No. PCT/JP2019/046702, dated Feb. 4, 2020.

International Preliminary Report on Patentability issued in PCT/JP2019/046702 dated Jun. 24, 2021 (6 pages).

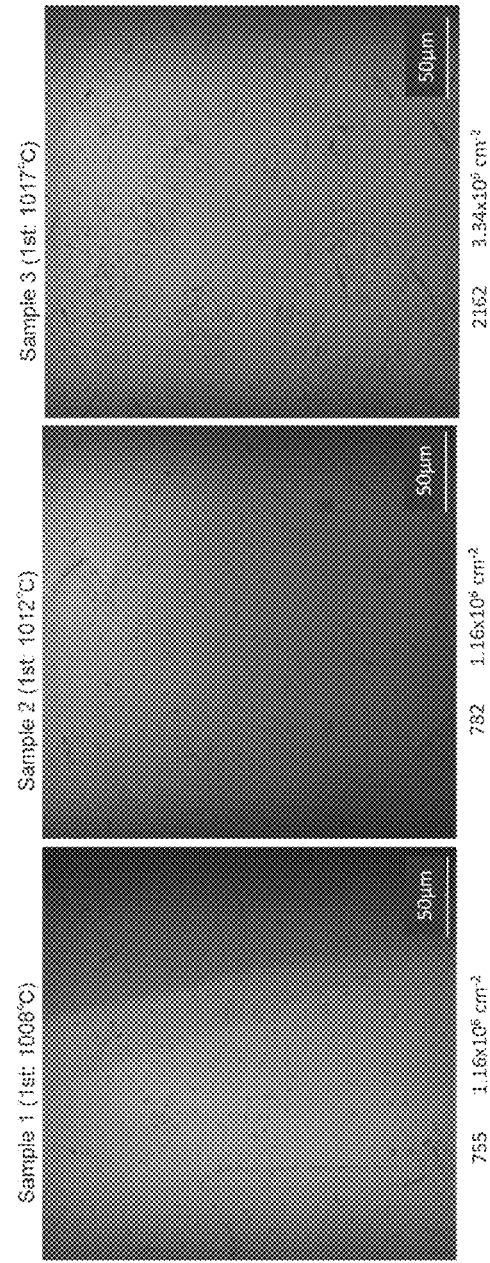

US 11,873,578 B2

METHOD FOR MANUFACTURING NITRIDE SEMICONDUCTOR SUBSTRATE AND NITRIDE SEMICONDUCTOR SUBSTRATE

CROSS-REFERENCE TO RELATED APPLICATIONS

The present application claims priority under 37 U.S.C. § 371 to International Patent Application No. PCT/JP2019/046702, filed Nov. 29, 2019, which claims priority to and the benefit of Japanese Patent Application Nos. 2018-234345, filed On Dec. 14, 2018, and 2019-063184, filed on Mar. 28, 2019. The contents of these applications are hereby incorporated by reference in their entirities.

TECHNICAL FIELD

The present disclosure relates to a method for manufacturing a nitride semiconductor substrate, and a nitride semiconductor substrate.

BACKGROUND ART

Various methods are disclosed to obtain a free-standing substrate that is constituted by a single crystal of a group III nitride semiconductor. Among those methods, a method for growing a nitride semiconductor layer on a sapphire substrate is disclosed as a simple process (e.g., Patent Document 1).

CITATION LIST

Patent Documents

Patent Document 1: Japanese Patent Application Laid-Open Publication No. 2017-226584

SUMMARY OF INVENTION

Technical Problem

An object of the present disclosure is to provide a technique with which a nitride semiconductor substrate having good crystal quality can be easily obtained.

Solution to Problem

According to an aspect of the present disclosure,
provided is a method for manufacturing a nitride semiconductor substrate by using a vapor phase growth method, including:
a step of preparing a base substrate that is constituted by a material different from a single crystal of a group III nitride semiconductor;
a step of growing a base layer that has a mirror-finished base surface and in which a low index crystal plane closest to the base surface is a (0001) plane, by epitaxially growing a single crystal of a group III nitride semiconductor on the upper side of the base substrate;
a first step of growing a first layer by epitaxially growing a single crystal of a group III nitride semiconductor directly on the base surface of the base layer, the single crystal of the group III nitride semiconductor having a top surface at which a (0001) plane is exposed, a plurality of recessed portions formed by inclined interfaces other than the (0001) plane being generated in the top surface, the inclined interfaces being gradually expanded toward an upper side of the base surface of the base layer to make the (0001) plane disappear from the top surface, and a surface of the first layer being constituted only by the inclined interfaces; and
a second step of growing a second layer that has a mirror-finished surface by epitaxially growing a single crystal of a group III nitride semiconductor on the first layer so as to make the inclined interfaces disappear,
wherein, in the first step, the plurality of recessed portions are generated in the top surface of the single crystal after the single crystal is grown so as to have a predetermined thickness with the (0001) plane serving as a growth surface.

According to another aspect of the present disclosure,
provided is a nitride semiconductor substrate that is constituted by a crystal of a group III nitride semiconductor and includes a main surface for which the closest low index crystal plane is a (0001) plane,
wherein, when dislocations are detected based on dark spots by observing the main surface using a multiphoton excitation microscope in a field of view of 250 μm square,
the main surface does not include a region that has a dislocation density higher than $5 \times 10^6$ cm$^{-2}$,
the main surface includes a plurality of dislocation arrays each constituted by at least three dislocations that are arranged at intervals of 1 μm or less along a predetermined direction,
the plurality of dislocation arrays include paraxial dislocation arrays each extending along a direction that forms an angle of 10° or less with respect to a <11-20> axis direction or a <1-100> axis direction, and
the density of the plurality of dislocation arrays in the main surface is $1 \times 10^6$ arrays/cm$^2$ or less.

According to another aspect of the present disclosure,
provided is a nitride semiconductor substrate that is constituted by a crystal of a group III nitride semiconductor and includes a main surface for which the closest low index crystal plane is a (0001) plane,
wherein, when dislocations are detected based on dark spots by observing the main surface using a multiphoton excitation microscope in a field of view of 250 μm square,
the main surface does not include a region that has a dislocation density higher than $5 \times 10^6$ cm$^{-2}$,
the main surface includes a plurality of dislocation arrays each constituted by at least three dislocations that are arranged at intervals of 1 μm or less along a predetermined direction,
the plurality of dislocation arrays include paraxial dislocation arrays each extending along a direction that forms an angle of 10° or less with respect to a <11-20> axis direction or a <1-100> axis direction, and
the paraxial dislocation arrays each have a length of 100 μm or less.

Advantageous Effects of Invention

According to the present disclosure, a nitride semiconductor substrate having good crystal quality can be easily obtained.

BRIEF DESCRIPTION OF DRAWINGS

FIGS. 14(a) to 14(c) are diagrams showing observation images obtained by observing main surfaces of nitride semiconductor substrates of samples 1 to 3, respectively, by using a multiphoton excitation microscope.

DESCRIPTION OF EMBODIMENTS

<Finding Obtained by Inventor>

First, findings obtained by the inventor will be described.

According to the method disclosed in Patent Document 1, a nitride semiconductor layer is grown on a sapphire substrate and is peeled away from the sapphire substrate when the temperature is reduced, to obtain a nitride semiconductor substrate from the peeled nitride semiconductor layer.

However, according to the method disclosed in Patent Document 1, if the nitride semiconductor layer is grown to be thick enough to stably obtain the nitride semiconductor substrate, fine cracks are generated in both the sapphire substrate and the nitride semiconductor layer while the nitride semiconductor layer is grown. If cracks are generated while the nitride semiconductor layer is grown as described above, abnormal crystal growth occurs at cross sections at which the nitride semiconductor layer cracked. In this case, the nitride semiconductor layer cannot spontaneously peel away from the sapphire substrate even when the temperature is reduced from a growth temperature of the nitride semiconductor layer, and the nitride semiconductor substrate cannot be stably obtained.

Also, according to the method disclosed in Patent Document 1, even if the nitride semiconductor layer is grown so as to have a thickness with which cracking does not occur, many dislocations are formed in the nitride semiconductor layer due to strain that is caused by lattice mismatch between the sapphire substrate and the nitride semiconductor. Therefore, even if the nitride semiconductor layer is obtained with no cracks by being peeled off, it is not possible to obtain a nitride semiconductor substrate having crystal quality that is high enough for the nitride semiconductor substrate to be used for a semiconductor device such as a light emitting diode (LED).

Therefore, a technique with which a nitride semiconductor substrate having good crystal quality can be easily obtained has been desired.

The present disclosure is based on the above findings by the inventor.

<First Embodiment of the Present Disclosure>

Hereinafter, a first embodiment of the present disclosure will be described with reference to the drawings.

(1) Method for Manufacturing a Nitride Semiconductor Substrate

Figure 1:
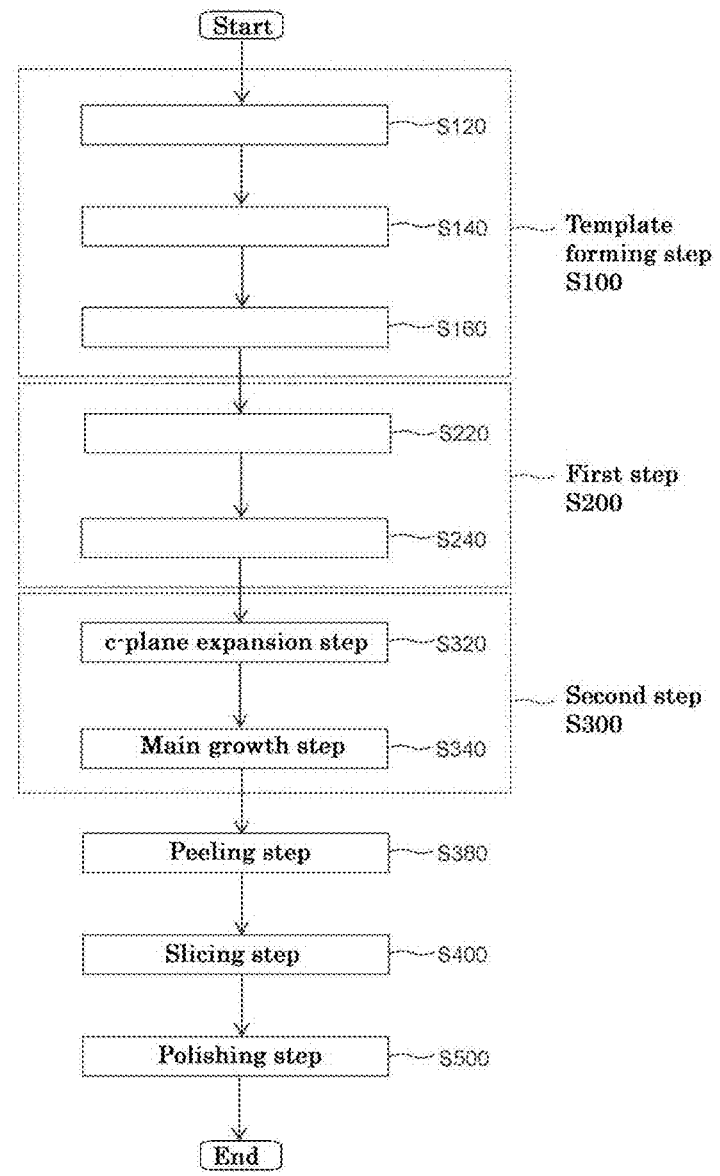
FIG. 1 is a flowchart illustrating a method for manufacturing a nitride semiconductor substrate according to a first embodiment of the present disclosure.
Figure 2:
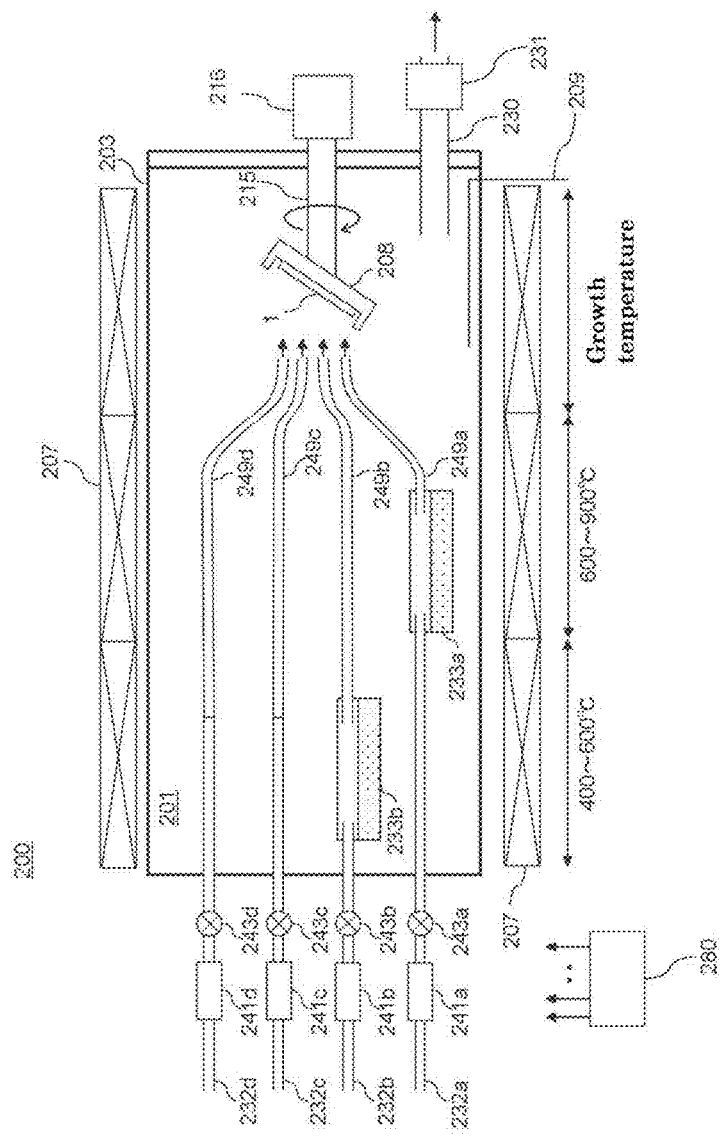
FIG. 2 is a schematic configuration diagram illustrating a vapor phase growth apparatus.
Figure 3A:
FIGS. 3(a) to 3(c) are schematic cross-sectional views illustrating a part of the method for manufacturing a nitride semiconductor substrate according to the first embodiment of the present disclosure.
Figure 3B:
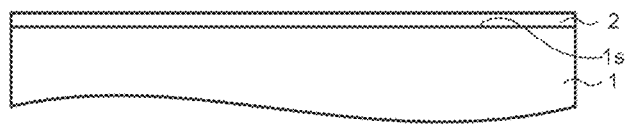
Figure 3C:
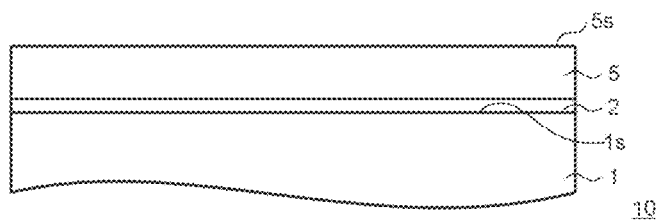

A method for manufacturing a nitride semiconductor substrate according to the present embodiment will be described with reference to FIGS. 1 to 7. FIG. 1 is a flowchart illustrating the method for manufacturing a nitride semiconductor substrate according to the present embodiment. FIG. 2 is a schematic configuration diagram illustrating a vapor phase growth apparatus. FIGS. 3(a) to 3(c), 4(a) to 4(c), and 6(a) to 7(b) are schematic cross-sectional views illustrating a part of the method for manufacturing a nitride semiconductor substrate according to the present embodiment. FIG. 5 is a schematic perspective view illustrating a part of the method for manufacturing a nitride semiconductor substrate according to the present embodiment. In FIGS. 3(a) to 3(c), the lower side of a base substrate 1 is omitted. In the drawings other than FIG. 3, a buffer layer 2 is omitted. FIG. 5 corresponds to a perspective view at a time point of FIG. 4(b), and illustrates a part of a first layer 30 that is grown on a base layer 5. Further, a thin solid line in FIG. 6(b) indicates a crystal plane in a process of growth, and dotted lines in FIGS. 4(c) to 7(b) indicate dislocations.

As illustrated in FIG. 1, the method for manufacturing a nitride semiconductor substrate according to the present embodiment includes a template forming step S100, a first step S200, a second step S300, a peeling step S380, a slicing step S400, and a polishing step S500, for example.

Hereinafter, in a crystal of a group III nitride semiconductor having a wurtzite structure, a <0001> axis (for example, [0001] axis) is referred to as a "c-axis", and a (0001) plane is referred to as a "c-plane". The (0001) plane may be referred to as a "+c plane (group III element polar plane)", and a (000-1) plane may be referred to as a "−c plane (nitrogen (N) polar plane)". Further, a <1-100> axis (for example, [1-100] axis) is referred to as an "m-axis", and a {1-100} plane is referred to as an "m-plane". The m-axis may be expressed as a <10-10> axis. Further, a <11-20> axis (for example, [11-20] axis) is referred to as an "a-axis", and a {11-20} plane is referred to as an "a-plane".

S100: Template Forming Step

First, a template 10 that includes a base substrate 1 and a base layer 5 is formed in the template forming step S100. The template forming step S100 in the present embodiment includes a base substrate preparation step S120, a buffer layer forming step S140, and a base layer forming step S160, for example.

S120: Base Substrate Preparation Step

First, as illustrated in FIG. 3(a), the base substrate 1 that is constituted by a material different from a group III nitride semiconductor is prepared. The linear expansion coefficient of the base substrate 1 differs from that of a group III nitride semiconductor, for example. Specifically, the base substrate 1 is a sapphire ($Al_2O_3$) substrate, for example.

The base substrate 1 has a main surface 1s that serves as a growth surface, for example. A low index crystal plane that is closest to the main surface 1s is the (0001) plane (c-plane), for example.

In the present embodiment, the main surface 1s of the base substrate 1 is a mirror surface, for example. The surface roughness RMS (root mean square roughness) of the main surface 1s is 1 nm or less, for example.

In the present embodiment, the c-plane of the base substrate 1 is inclined with respect to the main surface 1s. That is, the c-axis of the base substrate 1 is inclined with respect to the normal of the main surface 1s at a predetermined off-angle. The off-angle in the main surface 1s of the base substrate 1 is uniform over the entire main surface 1s. The off-angle in the main surface 1s of the base substrate 1 affects an off-angle in a base surface 5s of the base layer 5, which will be described later.

In the present embodiment, the diameter of the base substrate 1 is 1 inch or more, and preferably 2 inches or more, for example.

In the present embodiment, the thickness of the base substrate 1 is 300 µm or more and 2 mm or less, for example.

S140: Buffer Layer Forming Step

After the base substrate 1 is prepared, a buffer layer 2 that is constituted by a group III nitride semiconductor is formed on the main surface 1s of the base substrate 1 as illustrated in FIG. 3(b). In the present embodiment, an aluminum nitride (AlN) layer is formed as the buffer layer 2.

In the present embodiment, the buffer layer 2 is formed using a vapor phase growth apparatus 200 that is configured as a hydride vapor phase growth apparatus (HVPE apparatus), for example. In the present embodiment, steps from the buffer layer forming step S140 to the peeling step S380, which will be described later, are successively performed in the same vapor phase growth apparatus 200.

In the following description, a "film-forming gas" mainly refers to a source gas for growing a group III nitride semiconductor, and encompasses: hydrogen chloride (HCl) gas, which is a reactant gas for generating a group III source gas; ammonia ($NH_3$) gas, which is a nitrogen source gas; carrier gases such as hydrogen ($H_2$) gas and nitrogen ($N_2$) gas; and dichlorosilane ($SiH_2Cl_2$) gas, which is an n-type dopant gas.

As illustrated in FIG. 2, the vapor phase growth apparatus 200 includes an air-tight container 203 that is made of a heat-resistant material such as quartz and in which a film formation chamber 201 is formed. A susceptor 208 that supports the base substrate 1 is provided within the film formation chamber 201. The susceptor 208 is connected to a rotation shaft 215 of a rotation mechanism 216, and is configured to be able to rotate the base substrate 1 placed on the susceptor 208 in a circumferential direction (a direction extending along the main surface) while holding the base substrate 1 above using a gear that is provided on a back surface of the susceptor 208. A gas supply pipe 232a for supplying HCl gas into the film formation chamber 201, a gas supply pipe 232b for supplying HCl gas into the film formation chamber 201, a gas supply pipe 232c for supplying $NH_3$ gas into the film formation chamber 201, and a gas supply pipe 232d for supplying $H_2$ gas, $N_2$ gas, and $SiH_2Cl_2$ gas into the film formation chamber 201 are connected to an end of the air-tight container 203. Flow rate controllers 241a to 241d and valves 243a to 243d are provided on the gas supply pipes 232a to 232d, respectively, in this order from the upstream side. A gas generator 233a in which gallium (Ga) melt is accommodated as a raw material is provided downstream of the gas supply pipe 232a. A nozzle 249a is connected to the gas generator 233a to supply gallium chloride (GaCl) gas, which is a film-forming gas generated through reaction between HCl gas and Ga melt, toward the base substrate 1 or the like, which is held on the susceptor 208. Also, a gas generator 233b in which solid aluminum (Al) is accommodated as a raw material is provided downstream of the gas supply pipe 232b. A nozzle 249b is connected to the gas generator 233b to supply aluminum chloride ($AlCl_3$) gas, which is a film-forming gas generated through reaction between HCl gas and Al, toward the base substrate 1 or the like, which is held on the susceptor 208. Note that Al at a high temperature melts quartz, and therefore, inner sides of the gas generator 233b and the nozzle 249b are preferably constituted by a material other than quartz. Specifically, it is preferable that the gas generator 233b is made of PBN (Pyrolitic Boron Nitride), for example, and a liner casing (not shown) made of PBN is inserted into a portion of the nozzle 249b to which Al in the state of metal attaches, for example. Nozzles 249c and 249d are connected to downstream sides of the gas supply pipes 232c and 232d to supply film-forming gases supplied from these gas supply pipes toward the base substrate 1 or the like, which is held on the susceptor 208. The nozzles 249a to 249d are arranged such that film-forming gasses flow in a direction that intersects the main surface 1s of the base substrate 1 (i.e., an oblique direction with respect to the main surface 1s), for example. On the other hand, an exhaust pipe 230 for exhausting gas from the film formation chamber 201 is provided at the other end of the air-tight container 203. The exhaust pipe 230 is provided with a pump 231 (or a blower). A zone heater 207 that heats the insides of the gas generators 233a and 233b and the base substrate 1 or the like held on the susceptor 208 to desired temperatures is provided on the outer periphery of the air-tight container 203, and a temperature sensor 209 for measuring the temperature inside the film formation chamber 201 is provided within the air-tight container 203. A portion of the zone heater 207 near the gas generator 233b is kept at 400° C. to 600° C. to generate AlCl₃ gas through reaction between HCl gas and Al. Also, a portion of the zone heater 207 near the gas generator 233a is kept at 800° C. to 900° C. to generate GaCl gas through reaction between HCl gas and Ga melt. Also, a portion of the zone heater 207 near the susceptor 208 is kept at a growth temperature, which will be described later. Each member included in the vapor phase growth apparatus 200 is connected to a controller 280 that is configured as a computer, and a processing procedure and processing conditions, which will be described later, are controlled by a program that is executed by the controller 280.

In the buffer layer forming step S140, first, the base substrate 1 is placed on the susceptor 208. Also, Ga melt is accommodated as a raw material in the gas generator 233a, and solid Al is accommodated as a raw material in the gas generator 233b. Then, H₂ gas (or a gas mixture of H₂ gas and N₂ gas) is supplied from the gas supply pipe 232d into the film formation chamber 201 while the susceptor 208 is rotated and the inside of the film formation chamber 201 is heated and exhausted. Then, in a state where the inside of the film formation chamber 201 reached a desired growth temperature (e.g., 1000° C. or more and 1100° C. or less) and a desired growth pressure and the atmosphere within the film formation chamber 201 is a desired atmosphere, gases are supplied from the gas supply pipes 232b and 232c to supply AlCl₃ gas and NH₃ gas as film-forming gasses in a direction that intersects the main surface 1s of the base substrate 1.

Thus, the buffer layer 2 made of AlN is formed on the main surface 1s of the base substrate 1 as illustrated in FIG. 3(b). At this time, the thickness of the buffer layer 2 is 10 nm or more and 400 nm or less, for example.

After the buffer layer 2 is grown so as to have a predetermined thickness, supply of HCl gas from the gas supply pipe 232b into the film formation chamber 201 is stopped. On the other hand, supply of NH₃ gas, heating of the inside of the film formation chamber 201 by the heater 207, and exhausting of gas from the film formation chamber 201 by the pump 231 are continued.

S160: Base Layer Forming Step

After the buffer layer 2 is formed, the base layer 5 that is constituted by a single crystal of a group III nitride semiconductor is epitaxially grown on the buffer layer 2 as illustrated in FIG. 3(c). In the present embodiment, a gallium nitride (GaN) layer is formed as the base layer 5.

In the base layer forming step S160, first, the temperature inside the film formation chamber 201 is changed to a desired growth temperature of the base layer 5. If the growth temperature of the base layer 5 is equal to the growth temperature of the buffer layer 2, growth of the base layer 5 described below may be started without changing the temperature inside the film formation chamber 201. Then, in a state where the inside of the film formation chamber 201 reached the desired growth temperature and a desired growth pressure and the atmosphere within the film formation chamber 201 is a desired atmosphere, gasses are supplied from the gas supply pipes 232a and 232c to supply GaCl gas and NH₃ gas as film-forming gasses in a direction that intersects the main surface 1s of the base substrate 1.

Growth conditions for the base layer 5 are as follows, for example.
Growth temperature: 990° C. or more and 1,120° C. or less, preferably 1,020° C. or more and 1,100° C. or less
V/III ratio: 1 or more and 10 or less, preferably 1 or more and 5 or less
Growth pressure: 90 to 105 kPa, preferably 90 to 95 kPa
Partial pressure of GaCl gas: 1.5 to 15 kPa
N₂ gas flow rate/H₂ gas flow rate: 1 to 20

The "V/III ratio" is a ratio of a partial pressure of a flow rate of NH₃ gas to a partial pressure of GaCl gas serving as a group III source gas.

Thus, the base layer 5 constituted by a single crystal of GaN is formed on the buffer layer 2 as illustrated in FIG. 3(c).

At this time, the base surface 5s that is a main surface of the base layer 5 is mirror-finished. A "mirror-finished surface" as used herein means a surface in which a difference in the height between a recessed portion and a raised portion of the surface is no greater than a wavelength of visible light, and a hillock at which a facet other than the c-plane is exposed may be generated in the base surface 5s. By covering the entire main surface 1s of the base substrate 1 with the base layer 5 having the mirror-finished base surface 5s as described above, it is possible to make inclined interfaces 30i appear substantially uniformly in a plane of the first layer 30 in the first step S200, which will be described later.

When the base layer 5 is epitaxially grown on the main surface 1s that is constituted by the c-plane of the base substrate 1, a low index crystal plane that is closest to the base surface 5s of the base layer 5 is a +c plane.

At this time, the thickness of the base layer 5 is 1 μm or more and 20 μm or less, and preferably 1 μm or more and 10 μm or less, for example. If the thickness of the base layer 5 is less than 1 μm, it is difficult to make inclined interfaces 30i appear substantially uniformly in a plane of the first layer 30 in the first step S200 described later. In contrast, in the present embodiment, the thickness of the base layer 5 is 1 μm or more, and therefore, it is possible to stably make inclined interfaces 30i appear substantially uniformly in a plane of the first layer 30 in the first step S200 described later. On the other hand, if the thickness of the base layer 5 is greater than 20 μm, an epilayer (epitaxially grown layer) such as the base layer 5 becomes thick without strain caused by lattice mismatch between the base substrate 1 and the epilayer being mitigated. Therefore, cracks may be generated in the epilayer such as the base layer 5 in the base layer forming step S160 or the following steps. In contrast, in the present embodiment, the thickness of the base layer 5 is 20 μm or less, and therefore, it is possible to suppress generation of cracks in the epilayer such as the base layer 5 in the base layer forming step S160 or the following steps. Furthermore, when the thickness of the base layer 5 is 10 μm or less, it is possible to stably suppress generation of cracks in the epilayer such as the base layer 5.

The template 10 is formed in the template forming step S100 described above.

At this time, many dislocations are formed in the base layer 5 due to strain that is caused by lattice mismatch between the base substrate 1 and the base layer 5.

The dislocation density in the base surface 5s of the base layer 5 is greater than $5 \times 10^6$ cm$^{-2}$ and no greater than $1 \times 10^9$ cm$^{-2}$, for example.

When the formation of the template 10 is complete, supply of HCl gas from the gas supply pipe 232a into the film formation chamber 201 is stopped. On the other hand, supply of NH₃ gas, heating of the inside of the film formation chamber 201 by the heater 207, and exhausting of gas from the film formation chamber 201 by the pump 231 are continued.

S200: First Step (First Layer Growth Step, Three-Dimensional Growth Step)

After the template 10 is formed, the first step S200 described below is performed using the vapor phase growth apparatus 200 in the state where the template 10 is placed in the vapor phase growth apparatus 200.

Figure 4A:
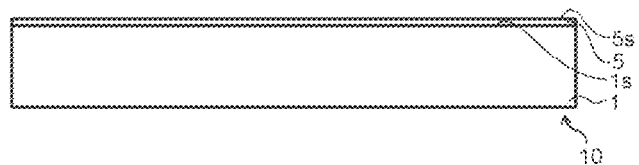
FIGS. 4(a) to 4(c) are schematic cross-sectional views illustrating a part of the method for manufacturing a nitride semiconductor substrate according to the first embodiment of the present disclosure.
Figure 5:
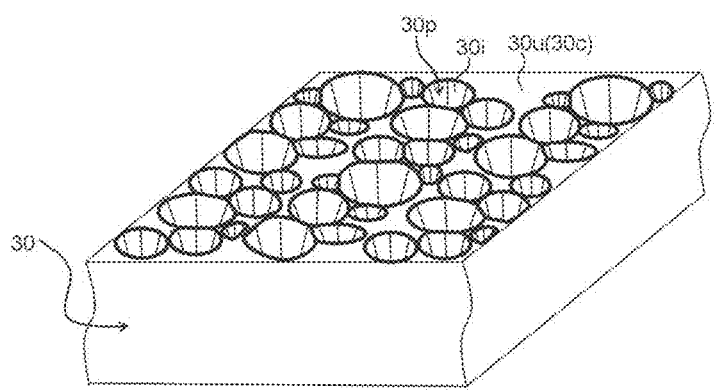
FIG. 5 is a schematic perspective view illustrating a part of the method for manufacturing a nitride semiconductor substrate according to the first embodiment of the present disclosure.

That is, as illustrated in FIG. 4(a), the first step S200 described below is performed using the template 10 in a state where none of patterning processing of a formation of a mask layer on the base surface 5s and patterning processing of a formation of an uneven pattern on the base substrate 1 or the base surface 5 is performed. The "mask layer" as used herein means a mask layer that is constituted by silicon oxide or the like, has predetermined openings, and is used in a so-called ELO (Epitaxial Lateral Overgrowth) method, for example. Also, the "uneven pattern" as used herein means at least either of a trench and a ridge that are formed by performing patterning directly on the base substrate 1 or the base layer 5 and are used in a so-called pendeo-epitaxy method. The uneven pattern referred to here has a difference in the height of 100 nm or more, for example. The template 10 of the present embodiment is used in the first step S200 in a state of not having the structures described above.

Figure 4B:
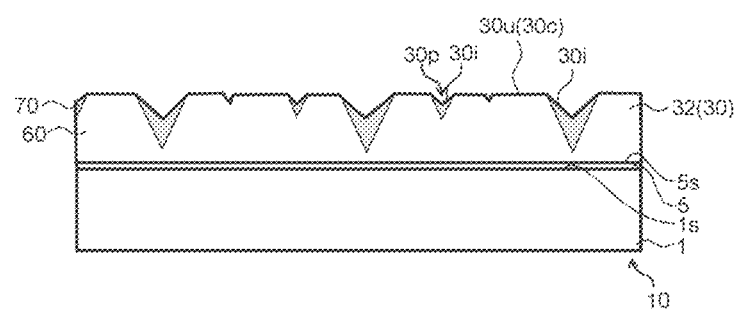
Figure 4C:
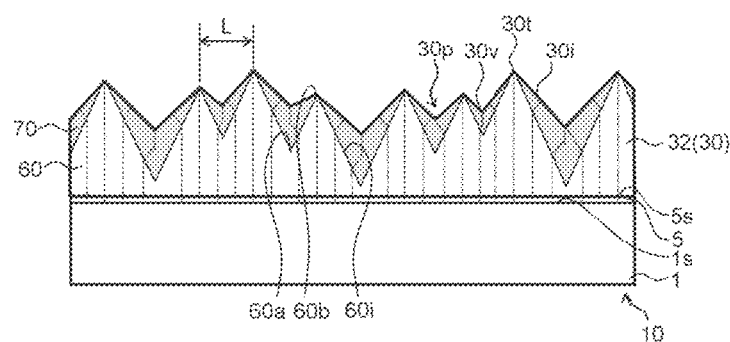

As illustrated in FIGS. 4(b), 4(c), and 5, in the first step S200, a single crystal of a group III nitride semiconductor that has a top surface 30u at which a c-plane 30c is exposed is epitaxially grown directly on the base surface 5s of the base layer 5. Thus, the first layer (three-dimensional growth layer) 30 is grown.

At this time, a plurality of recessed portions 30p surrounded by inclined interfaces 30i other than the c-plane are generated in the top surface 30u of the single crystal, and the inclined interfaces 30i are gradually expanded and the c-plane 30c is gradually contracted toward an upper side of the base surface 5s of the base layer 5. Thereby, the c-plane 30c disappears from the top surface 30u. As a result, the first layer 30 whose surface is constituted only by the inclined interfaces 30i is grown.

That is, in the first step S200, the first layer 30 is three-dimensionally grown so as to intentionally roughen the base surface 5s of the base layer 5. Even though the first layer 30 is grown in such a manner, the first layer 30 is grown as a single crystal as described above.

In the present embodiment, for example, a layer that is constituted by the same group III nitride semiconductor as the group III nitride semiconductor constituting the base layer 5 is epitaxially grown as the first layer 30. That is, for example, a GaN layer is epitaxially grown as the first layer 30.

Specifically, in the first step S200 performed after the template forming step S100, the temperature inside the film formation chamber 201 is changed to a desired growth temperature of the first layer 30. When the growth temperature of the first layer 30 is equal to the growth temperature of the base layer 5, growth of the first layer 30 may be started without changing the temperature inside the film formation chamber 201. Then, in a state where the inside of the film formation chamber 201 reached the desired growth temperature and a desired growth pressure and the atmosphere within the film formation chamber 201 is a desired atmosphere, gasses are supplied from the gas supply pipes 232a and 232c to supply GaCl gas and NH$_3$ gas as film-forming gasses in a direction that intersects the main surface 1s of the base substrate 1.

Here, in order to realize the above-described growth process, the first layer 30 is grown under a predetermined first growth condition in the first step S200, for example.

Figure 8A:
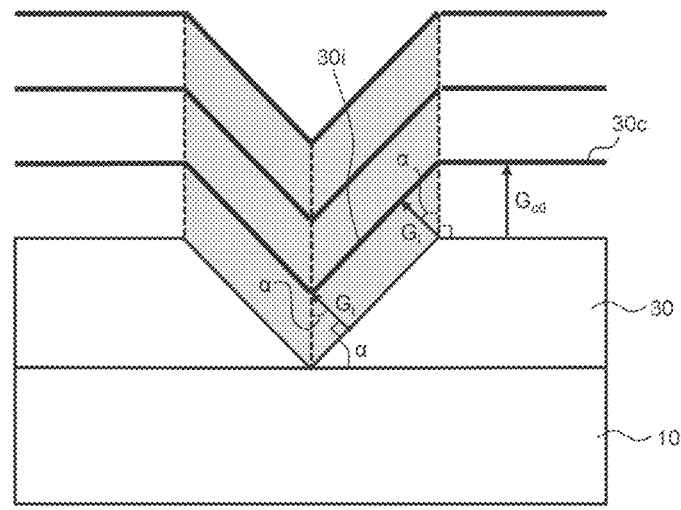
FIG. 8(a) is a schematic cross-sectional view illustrating a growth process under a reference growth condition under which an inclined interface and a c-plane are neither expanded nor contracted.

First, a reference growth condition under which the inclined interface 30i and the c-plane 30c are neither expanded nor contracted will be described with reference to FIG. 8(a). FIG. 8(a) is a schematic cross-sectional view illustrating a growth process under the reference growth condition under which the inclined interface and the c-plane are neither expanded nor contracted.

In FIG. 8(a), a thick solid line indicates the surface of the first layer 30 for each unit time. The inclined interface 30i illustrated in FIG. 8(a) is the inclined interface that is most inclined with respect to the c-plane 30c. Further, in FIG. 8(a), $G_{c0}$ represents a growth rate of the c-plane 30c of the first layer 30, $G_i$ represents a growth rate of the inclined interface 30i of the first layer 30, and a represents an angle formed by the c-plane 30c and the inclined interface 30i in the first layer 30. Also, in FIG. 8(a), the first layer 30 grows while maintaining the angle α formed by the c-plane 30c and the inclined interface 30i. The off-angle of the c-plane 30c of the first layer 30 is negligible as compared with the angle α formed by the c-plane 30c and the inclined interface 30i.

As illustrated in FIG. 8(a), when each of the inclined interface 30i and the c-plane 30c is neither expanded nor contracted, a locus of an intersection between the inclined interface 30i and the c-plane 30c is perpendicular to the c-plane 30c. Therefore, the reference growth condition under which each of the inclined interface 30i and the c-plane 30c is neither expanded nor contracted satisfies the following formula (a).

$$G_{c0} = G_i / \cos\alpha \tag{a}$$

Figure 8B:
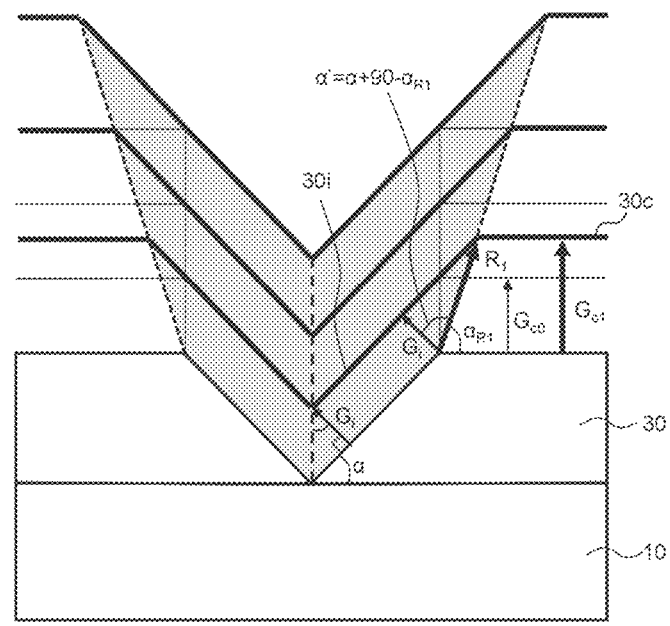
FIG. 8(b) is a schematic cross-sectional view illustrating a growth process under a first growth condition under which the inclined interface is expanded and the c-plane is contracted.

Next, the first growth condition under which the inclined interface 30i is expanded and the c-plane 30c is contracted will be described with reference to FIG. 8(b). FIG. 8(b) is a schematic cross-sectional view illustrating a growth process under the first growth condition under which the inclined interface is expanded and the c-plane is contracted.

In FIG. 8(b), as in FIG. 8(a), a thick solid line indicates the surface of the first layer 30 for each unit time. Further, the inclined interface 30i illustrated in FIG. 8(b) is also the inclined interface most inclined with respect to the c-plane 30c. Also, in FIG. 8(b), $G_{c1}$ represents a growth rate of the c-plane 30c of the first layer 30, and $R_1$ represents a progress rate of the locus of the intersection between the inclined interface 30i and the c-plane 30c of the first layer 30. Further, $\alpha_{R1}$ represents a narrower angle of angles formed by the c-plane 30c and the locus of the intersection between the inclined interface 30i and the c-plane 30c. When α' represents an angle formed by $R_1$ direction and $G_i$ direction, $\alpha' = \alpha + 90 - \alpha_{R1}$ is satisfied. The off-angle of the c-plane 30c of the first layer 30 is negligible as compared with the angle a formed by the c-plane 30c and the inclined interface 30i.

As illustrated in FIG. 8(b), the progress rate $R_i$ of the locus of the intersection between the inclined interface 30i and the c-plane 30c is represented by the following formula (b).

$$R_1 = G_i / \cos\alpha' \tag{b}$$

Further, the growth rate $G_{c1}$ of the c-plane 30c of the first layer 30 is represented by the following formula (c).

$$G_{c1} = R_1 \sin\alpha_{R1} \tag{c}$$

By substituting the formula (b) into the formula (c), $G_{c1}$ is represented by the following formula (d) using $G_i$.

$$G_{c1} = G_i \sin\alpha_{R1} / \cos(\alpha + 90 - \alpha_{R1}) \tag{d}$$

In order for the inclined interface 30i to expand and the c-plane 30c to contract, $\alpha_{R1} < 90°$ is preferable. Accordingly, the first growth condition under which the inclined interface 30$i$ is expanded and the c-plane 30$c$ is contracted preferably satisfies the following formula (1), due to satisfying formula (d) and $\alpha_{R1}$<90°, $$G_{c1} > G_i / \cos \alpha \quad (1)$$

wherein, as described above, $G_i$ represents the growth rate of the inclined interface 30$i$ most inclined with respect to the c-plane 30$c$, and $\alpha$ represents the angle formed by the c-plane 30$c$ and the inclined interface 30$i$ most inclined with respect to the c-plane 30$c$.

Alternatively, it can be considered that $G_{c1}$ under the first growth condition is preferably larger than $G_{c0}$ under the reference growth condition. In this respect as well, the formula (1) can be derived by substituting the formula (a) into $G_{c1} > G_{c0}$.

Since the growth condition for expanding the inclined interface 30$i$ most inclined with respect to the c-plane 30$c$ is the strictest condition, when the first growth condition satisfies the formula (1), the other inclined interfaces 30$i$ can also be expanded.

Specifically, for example, when the inclined interface 30$i$ most inclined with respect to the c-plane 30$c$ is the {10-11} plane, $\alpha$=61.95°. Accordingly, the first growth condition preferably satisfies, for example, the following formula (1').

$$G_{c1} > 2.13 G_i \quad (1')$$

Alternatively, for example, when inclined interfaces 30$i$ are {11-2 m} planes satisfying m≥3 as described later, the inclined interface 30$i$ most inclined with respect to the c-plane 30$c$ is the {11-23} plane, and therefore, $\alpha$=47.3°. Accordingly, the first growth condition preferably satisfies, for example, the following formula (1").

$$G_{c1} > 1.47 G_i \quad (1'')$$

As the first growth condition of the present embodiment, for example, the growth temperature in the first step S200 is set lower than the growth temperature in the second step S300, which will be described later. Specifically, the growth temperature in the first step S200 is set to, for example, 980° C. or higher and 1,020° C. or lower, and preferably 1,000° C. or higher and 1,020° C. or lower.

Further, as the first growth condition of the present embodiment, for example, the V/III ratio in the first step S200 may be set larger than the V/III ratio in the second step S300 described later. Specifically, the V/III ratio in the first step S200 is set to, for example, 2 or more and 20 or less, and preferably 2 or more and 15 or less.

In practice, at least either of the growth temperature and the V/III ratio is adjusted as the first growth condition within the above-described ranges so as to satisfy the formula (1).

Other conditions of the first growth condition according to the present embodiment are as follows, for example.

Growth pressure: 90 to 105 kPa, preferably 90 to 95 kPa
Partial pressure of GaCl gas: 1.5 to 15 kPa
$N_2$ gas flow rate/$H_2$ gas flow rate: 0 to 1

Here, the first step S200 of the present embodiment is classified into two steps based on the form of the first layer 30 while growing, for example. Specifically, the first step S200 of the present embodiment includes, for example, an inclined interface expansion step S220 and an inclined interface maintenance step S240. Through these steps, for example, an expanded inclined interface layer 32 and an inclined interface maintaining layer 34 are formed as the first layer 30.

S220: Inclined Interface Expansion Step

First, as illustrated in FIGS. 4(b) and 5, the expanded inclined interface layer 32 of the first layer 30 constituted by a single crystal of a group III nitride semiconductor is epitaxially grown directly on the base surface 5$s$ of the base layer 5 under the first growth condition described above.

In an initial stage of the growth of the expanded inclined interface layer 32, the expanded inclined interface layer 32 undergoes step-flow growth (two-dimensional growth) to a predetermined thickness in the normal direction (a direction extending along the c-axis) of the base surface 5$s$ of the base layer 5, with the c-plane 30$c$ serving as the growth surface. Here, the portion of the expanded inclined interface layer 32 grown with the c-plane 30$c$ serving as the growth surface will also be referred to as an "initial layer". At this time, the initial layer is grown over the entire base surface 5$s$ of the base layer 5, for example. Thus, the initial layer that has a mirror-finished surface is formed with the predetermined thickness. The thickness of the initial layer is 1 μm or more and 100 μm or less, and preferably 1 μm or more and 20 μm or less, for example.

Thereafter, by gradually growing the expanded inclined interface layer 32 under the first growth condition, a plurality of recessed portions 30$p$ formed by the inclined interfaces 30$i$ other than the c-plane are generated in the top surface 30$u$ of the expanded inclined interface layer 32 at which the c-plane 30$c$ is exposed as illustrated in FIGS. 4(b) and 5. The plurality of recessed portions 30$p$ formed by the inclined interfaces 30$i$ other than the c-plane are randomly formed in the top surface 30$u$. Thus, the expanded inclined interface layer 32 is formed, in which the c-plane 30$c$ and the inclined interfaces 30$i$ other than the c-plane coexist at the surface.

The term "inclined interface 30$i$" as used herein means a growth interface inclined with respect to the c-plane 30$c$, and includes low-index facets other than the c-plane, high-index facets other than the c-plane, and inclined faces that cannot be represented by indices of crystal plane (Miller indices). Facets other than the c-plane are, for example, {11-2m}, {1-10n}, and the like. Wherein m and n are integers other than 0.

In the present embodiment, a {11-2m} plane that satisfies m≥3 can be generated as the inclined interface 30$i$ by using the above-described template 10 and adjusting the first growth condition so as to satisfy the formula (1), for example. Thus, the inclination angle of the {11-2m} plane with respect to the c-plane 30$c$ can be made moderate. Specifically, the inclination angle can be 47.3° or less.

By further growing the expanded inclined interface layer 32 under the first growth condition, as illustrated in FIGS. 4(b) and 4(c), the inclined interfaces 30$i$ other than the c-plane are gradually expanded and the c-plane 30$c$ is gradually contracted in the expanded inclined interface layer 32 toward the upper side of the base surface 5$s$ of the base layer 5. At this time, the inclination angle formed by the inclined interfaces 30$i$ with respect to the base surface 5$s$ of the base layer 5 gradually decreases toward the upper side of the base surface 5$s$ of the base layer 5. Thus, most of the inclined interfaces 30$i$ finally become {11-2m} planes satisfying m≥3 as described above.

When the expanded inclined interface layer 32 is further grown, the c-plane 30$c$ of the expanded inclined interface layer 32 disappears from the top surface 30$u$, and the surface (outermost surface) of the expanded inclined interface layer 32 is constituted only by the inclined interfaces 30$i$.

In this way, by forming a plurality of recessed portions 30$p$ by the inclined interfaces 30$i$ other than the c-plane in the top surface 30$u$ of the expanded inclined interface layer 32 and making the c-plane 30$c$ disappear, as illustrated in FIG. 4(c), a plurality of valleys 30$v$ and a plurality of peaks 30t are formed on the surface of the expanded inclined interface layer 32. The plurality of valleys 30v are each an inflection point that is convex downward in the surface of the expanded inclined interface layer 32, and are formed above positions at which the inclined interfaces 30i other than the c-plane are generated. On the other hand, the plurality of peaks 30t are each an inflection point that is convex upward in the surface of the expanded inclined interface layer 32, and are formed at or above positions at which the c-plane 30c (finally) disappears between a pair of inclined interfaces 30i that expand in opposite directions. The valleys 30v and the peaks 30t are formed alternately in a direction extending along the main surface 1s of the base substrate 1 (the base surface 5s of the base layer 5).

As described above, in the present embodiment, in the initial stage of the growth of the expanded inclined interface layer 32, the expanded inclined interface layer 32 is grown so as to have the predetermined thickness on the base surface 5s of the base layer 5 with the c-plane 30c serving as the growth surface without the inclined interfaces 30i being generated, and thereafter the inclined interfaces 30i other than the c-plane are generated in the surface of the expanded inclined interface layer 32. Therefore, the plurality of valleys 30v are formed at positions that are spaced upward from the base surface 5s of the base layer 5.

Due to the growth process of the expanded inclined interface layer 32 described above, dislocations bend and propagate as follows. Specifically, as illustrated in FIG. 4(c), a plurality of dislocations extending along the c-axis in the base layer 5 propagate from the base surface 5s of the base layer 5 in a direction extending along the c-axis of the expanded inclined interface layer 32. In a region of the expanded inclined interface layer 32 that has grown with the c-plane 30c as a growth surface, the dislocations propagate from the base layer 5 in the direction extending along the c-axis of the expanded inclined interface layer 32. However, when the growth surface at which the dislocations are exposed changes from the c-plane 30c to an inclined interface 30i in the expanded inclined interface layer 32, the dislocations bend at the position at which the inclined interface 30i is exposed, and propagate in a direction that is substantially perpendicular to the inclined interface 30i. That is, the dislocations bend and propagate in a direction that is inclined with respect to the c-axis. Thus, in the steps after the inclined interface expansion step S220, the dislocations are locally collected above substantially the center between each pair of peaks 30t. As a result, a dislocation density in a surface of the second layer 40, which will be described later, can be lowered.

At this time, in the present embodiment, when an arbitrary cross section perpendicular to the main surface 1s of the base substrate 1 is observed, an average distance (also called "an average distance between closest peaks") L between a pair of peaks 30t spaced apart from each other in the direction extending along the main surface 1s of the base substrate 1 is, for example, 1 µm or more, preferably 10 µm or more, more preferably 30 µm or more, and further preferably 50 µm or more, the pair of peaks being closest to each other among the plurality of peaks 30t with one of the plurality of valleys 30v sandwiched between them. Note that the average distance L between closest peaks is a distance in a cross section that is observed when the c-plane 30c has disappeared from a crystal growth interface. The average distance L between closest peaks in the present embodiment tends to be shorter than an average distance between closest peaks of a case where the first step is performed under the same first growth condition using a GaN free-standing substrate.

If the average distance L between closest peaks is less than 1 µm as in the case where the first layer is grown in the manner of islands from the initial stage of the inclined interface expansion step S220, a distance by which the dislocations bend and propagate in the steps after the inclined interface expansion step S220 becomes short. Therefore, the dislocations cannot be sufficiently collected above substantially the center between each pair of peaks 30t of the expanded inclined interface layer 32. As a result, the dislocation density in the surface of the second layer 40 described later may be not sufficiently lowered. In contrast, in the present embodiment, since the average distance L between closest peaks is 1 µm or more, at least a distance of 0.5 µm can be secured for the dislocations to bend and propagate in the steps after the inclined interface expansion step S220. Thus, the dislocations can be sufficiently collected above substantially the center between each pair of peaks 30t of the expanded inclined interface layer 32. As a result, the dislocation density in the surface of the second layer 40 described later can be sufficiently lowered. The distance by which the dislocations bend and propagate can be further increased and the dislocation density in the surface of the second layer 40 described later can be more reliably lowered by setting the average distance L between closest peaks to preferably 10 µm or more, more preferably 30 µm or more, and further preferably 50 µm or more.

On the other hand, in the present embodiment, the average distance L between closest peaks is less than 800 µm, and preferably 200 µm or less. If the average distance L between closest peaks is 800 µm or more, the height from the main surface 1s of the base substrate 1 from the valley 30v to the peak 30t of the expanded inclined interface layer 32 becomes excessively large. Therefore, the thickness of the second layer 40 until the second layer is mirror-finished in the flattening step S300 described later becomes thick. In contrast, in the present embodiment, since the average distance L between closest peaks is less than 800 µm, the height from the main surface 1s of the base substrate 1 from the valley 30v to the peak 30t of the expanded inclined interface layer 32 can be lowered. Therefore, the second layer 40 can be quickly mirror-finished. When the average distance L between closest peaks is 200 µm or less, the second layer 40 can be mirror-finished more quickly.

Further, at this time, a first c-plane growth region 60 and an inclined interface growth region (high oxygen concentration region) 70 (gray part in the figure) are formed in the expanded inclined interface layer 32, based on a difference in growth surfaces during the growth process.

The first c-plane growth region 60 is a region that has grown with the c-plane 30c serving as a growth surface. The first c-plane growth region 60 includes a plurality of valleys 60a and a plurality of mountains 60b in a cross-sectional view, for example. Each of the valleys 60a and the mountains 60b referred to herein means a part of a shape that is observed based on a difference in the light emission intensity when a cross section of a laminated structure 90 is observed using a fluorescence microscope or the like, and does not mean a part of the shape of an outermost surface generated during the growth of the first layer 30. The plurality of valleys 60a are each an inflection point that is convex downward in the first c-plane growth region 60 in a cross-sectional view, and are formed at positions at which the inclined interfaces 30i are generated. At least one of the plurality of valleys 60a is provided at a position that is spaced upward from the main surface 1s of the base substrate 1. On the other hand, the plurality of mountains 60b are each an inflection point that is convex upward in the first c-plane growth region 60 in a cross-sectional view, and are formed at positions at which the c-plane 30c (finally) disappears and terminates between a pair of inclined interfaces 30i that expand in opposite directions. The valleys 60a and the mountains 60b are formed alternately in a direction extending along the main surface 1s of the base substrate 1.

When an arbitrary cross section perpendicular to the main surface 1s of the base substrate 1 is observed, an average distance between a pair of mountains 60b spaced apart from each other in the direction extending along the main surface 1s of the base substrate 1 corresponds to the above-described average distance L between closest peaks of the first layer 30, the pair of mountains 60b being closest to each other among the plurality of mountains 60b with one of the plurality of valleys 60a sandwiched between them.

The first c-plane growth region 60 includes a pair of inclined portions 60i that are formed on opposite sides of each of the plurality of mountains 60b as loci of intersections between the c-plane 30c and the inclined interfaces 30i. Each of the inclined portions 60i referred to herein means a part of a shape observed based on a difference in the light emission intensity when a cross section of the laminated structure 90 is observed using a fluorescence microscope or the like, and does not mean the inclined interface 30i at the outermost surface generated during the growth of the first layer 30.

On the other hand, the inclined interface growth region 70 is a region that has grown with the inclined interfaces 30i other than the c-plane serving as growth surfaces. A lower surface of the inclined interface growth region 70 conforms to the shape of the first c-plane growth region 60, for example.

Oxygen is easily taken into the inclined interface growth region 70, as compared with the first c-plane growth region 60. Therefore, the oxygen concentration in the inclined interface growth region 70 is higher than the oxygen concentration in the first c-plane growth region 60. The oxygen taken into the inclined interface growth region 70 is, for example, oxygen that is unintentionally introduced into the vapor phase growth apparatus 200, oxygen that is released from a member (the air-tight container 203 or the like) constituting the vapor phase growth apparatus 200, or the like.

The oxygen concentration in the first c-plane growth region 60 is $5 \times 10^{16}$ cm$^{-3}$ or less, and preferably $3 \times 10^{16}$ cm$^{-3}$ or less, for example. On the other hand, the oxygen concentration in the inclined interface growth region 70 is $9 \times 10^{17}$ cm$^{-3}$ or more and $5 \times 10^{19}$ cm$^{-3}$ or less, for example.

S240: Inclined Interface Maintenance Step

Figure 6A:
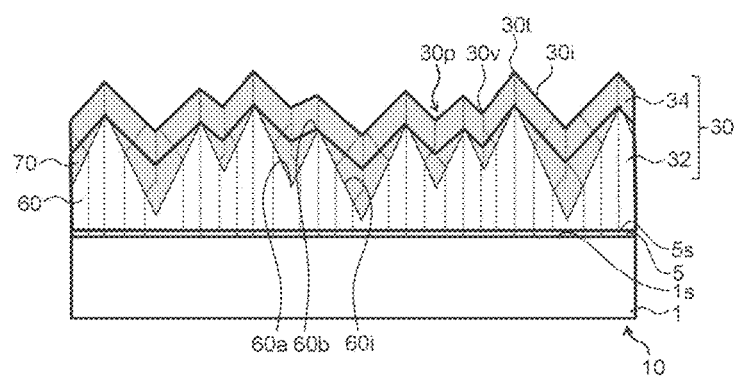
FIGS. 6(a) and 6(b) are schematic cross-sectional views illustrating a part of the method for manufacturing a nitride semiconductor substrate according to the first embodiment of the present disclosure.

After the c-plane 30c has disappeared from the surface of the expanded inclined interface layer 32, as illustrated in FIG. 6(a), the growth of the first layer 30 is continued over a predetermined thickness while a state where the inclined interfaces 30i occupy a larger portion of the surface than the c-plane 30c, or preferably a state where the surface is constituted only by the inclined interfaces 30i is maintained. Thus, the inclined interface maintaining layer 34 that has a surface in which the inclined interfaces 30i occupy a larger portion than the c-plane 30c, or preferably a surface that does not include the c-plane and is constituted only by the inclined interfaces 30i is formed on the expanded inclined interface layer 32. By forming the inclined interface maintaining layer 34, it is possible to make sure that the c-plane 30c disappears over the entire surface of the first layer 30. Note that a part in which the c-plane 30c is generated may be formed in the growth process of the inclined interface maintaining layer 34.

Here, in order to reliably bend the propagation direction of dislocations in the first step S200 as described above to lower the dislocation density, it is important that the c-plane 30c disappears at least once in a history of a growth interface at an arbitrary position in the first layer 30. Therefore, it is desirable that the c-plane 30c disappears at least once in an early stage of the first step S200 (e.g., in the inclined interface expansion step S220 described above).

However, the c-plane 30c may reappear in a part of the surface of the inclined interface maintaining layer 34 in the inclined interface maintenance step S240 after the c-plane 30c has disappeared at least once. However, it is preferable to mainly expose the inclined interfaces 30i at the surface of the inclined interface maintaining layer 34, so that an area ratio of the inclined interface growth region 70 is 80% or more in a cross section taken along the main surface 1s of the base substrate 1. The higher the area ratio occupied by the inclined interface growth region 70 in the cross section, the better, and it is preferable that the area ratio is 100%.

At this time, the first growth condition is maintained in the inclined interface maintenance step S240, similarly to the inclined interface expansion step S220. As a result, the inclined interface maintaining layer 34 can be grown with only the inclined interfaces 30i serving as growth surfaces.

At this time, as a result of the inclined interface maintaining layer 34 being grown under the first growth condition with the inclined interfaces 30i serving as growth surfaces, the dislocations that bend and propagate in the direction inclined with respect to the c-axis at positions where the inclined interfaces 30i are exposed in the expanded inclined interface layer 32 as described above continue to propagate in the same direction in the inclined interface maintaining layer 34.

Also, at this time, as a result of the inclined interface maintaining layer 34 growing with the inclined interfaces 30i serving as growth surfaces, the entire inclined interface maintaining layer 34 becomes a part of the inclined interface growth region 70. Thus, the inclined interface growth region 70 is formed continuously along the main surface 1s of the base substrate 1.

Through the first step S200 described above, the first layer 30 including the inclined interface expanded layer 32 and the inclined interface maintaining layer 34 is formed.

In the first step S200 of the present embodiment, the height from the main surface 1s of the base substrate 1 to the peak 30t of the first layer 30 (the maximum height of the first layer 30 in the thickness direction including the thickness of the base layer 5) is, for example, greater than 300 μm and 2 mm or less, preferably 400 μm or more and less than 1.5 mm, and more preferably 500 μm or more and 1 mm or less.

After the growth of the first layer 30 is complete, supply of HCl gas from the gas supply pipe 232a into the film formation chamber 201 is stopped. On the other hand, supply of NH$_3$ gas, heating of the inside of the film formation chamber 201 by the heater 207, and exhausting of gas from the film formation chamber 201 by the pump 231 are continued.

S300: Second Step (Second Layer Growth Step, Flattening Step)

Figure 6B:
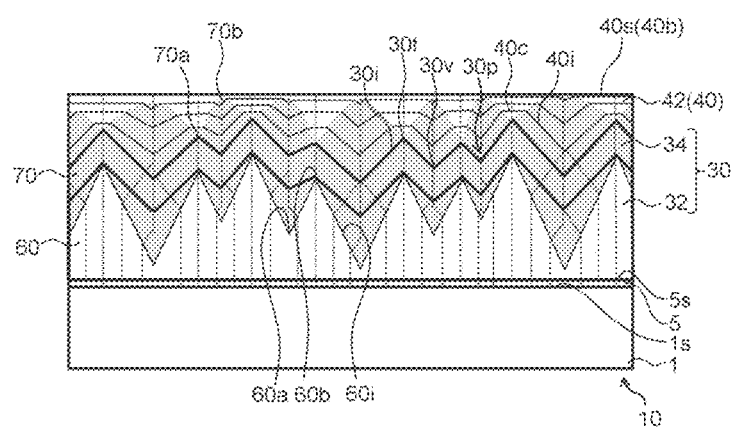
Figure 7A:
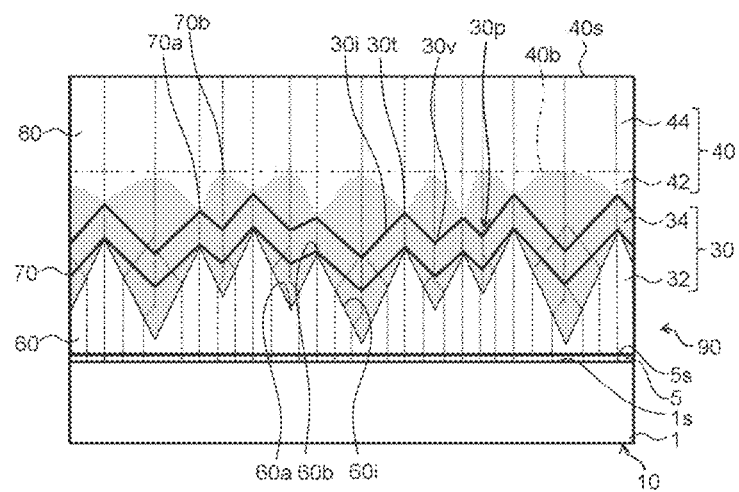
FIGS. 7(a) and 7(b) are schematic cross-sectional views illustrating a part of the method for manufacturing a nitride semiconductor substrate according to the first embodiment of the present disclosure.

After the first layer 30 in which the c-plane 30c has disappeared is grown, a single crystal of a group III nitride semiconductor is further epitaxially grown on the first layer 30 as illustrated in FIGS. 6(b) and 7(a).

At this time, inclined interfaces 40i are gradually contracted and a c-plane 40c is gradually expanded toward the upper side of the base surface 5s of the base layer 5. Thereby, the inclined interfaces 30i formed at the surface of the first layer 30 disappear. As a result, the second layer (flattening layer) 40 that has a mirror-finished surface 40s is grown. The "mirror-finished surface" as used herein means a surface in which the largest difference in the height between a recessed portion and a raised portion of the surface that are adjacent to each other is no greater than a wavelength of visible light.

In the present embodiment, a layer that is mainly composed of the same group III nitride semiconductor as the group III nitride semiconductor constituting the first layer 30 is epitaxially grown as the second layer 40, for example. That is, a GaN layer is epitaxially grown as the second layer 40, for example. Note that the second layer 40 is doped with silicon (Si), for example.

Specifically, in the second step S300 performed after the first step S200, first, the temperature inside the film formation chamber 201 is changed to a desired growth temperature of the second layer 40. Then, in a state where the inside of the film formation chamber 201 reached the desired growth temperature and a desired growth pressure and the atmosphere within the film formation chamber 201 is a desired atmosphere, gasses are supplied from the gas supply pipes 232a, 232c, and 232d to supply GaCl gas, NH₃ gas, and SiH₂Cl₂ gas as film-forming gasses in a direction that intersects the main surface 1s of the base substrate 1. As the n-type dopant gas, GeCl₄ gas or the like may be supplied instead of the SiH₂Cl₂ gas.

Here, in order to realize the above-described growth process, the second layer 40 is grown under a predetermined second growth condition in the second step S300, for example.

Figure 9:
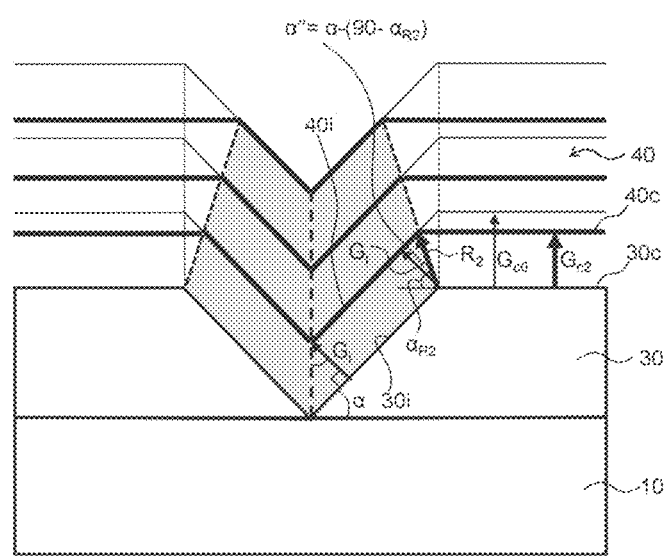
FIG. 9 is a schematic cross-sectional view illustrating a growth process under a second growth condition under which the inclined interface is contracted and the c-plane is expanded.

The second growth condition under which the inclined interface 40i is contracted and the c-plane 40c is expanded will be described with reference to FIG. 9. FIG. 9 is a schematic cross-sectional view illustrating a growth process under the second growth condition under which the inclined interface is contracted and the c-plane is expanded. FIG. 9 illustrates a process of the second layer 40 growing on the first layer 30 where an inclined interface 30i that is most inclined with respect to the c-plane 30c is exposed.

In FIG. 9, as in FIG. 8(a), the thick solid line indicates the surface of the second layer 40 for each unit time. Further, in FIG. 9, $G_{c2}$ represents a growth rate of the c-plane 40c of the second layer 40, $G_i$ represents a growth rate of the inclined interface 40i of the second layer 40, and $R_2$ represents a progress rate of a locus of an intersection between the inclined interface 40i and the c-plane 40c in the second layer 40. Further, $\alpha_{R2}$ represents a narrower angle of angles formed by the c-plane 30c and the locus of the intersection between the inclined interface 40i and the c-plane 40c. When $\alpha''$ represents an angle formed by $R_2$ direction and $G_i$ direction, $\alpha''=\alpha-(90-\alpha_{R2})$ is satisfied. Further, in FIG. 9, the second layer 40 grows while maintaining the angle a formed by the c-plane 30c and the inclined interface 30i in the first layer 30. The off-angle of the c-plane 40c of the second layer 40 is negligible as compared with the angle a formed by the c-plane 30c and the inclined interface 30i.

As illustrated in FIG. 9, the progress rate $R_2$ of the locus of the intersection between the inclined interface 40i and the c-plane 40c is represented by the following formula (e).

$$R_2 = G_i/\cos \alpha''  \quad (e)$$

Further, the growth rate $G_{c2}$ of the c-plane 40c of the second layer 40 is represented by the following formula (f).

$$G_{c2} = R_2 \sin \alpha_{R2}  \quad (f)$$

By substituting the formula (e) into the formula (f), $G_{c2}$ is represented by the following formula (g) using $G_i$.

$$G_{c2} = G_i \sin \alpha_{R2}/\cos(\alpha+\alpha_{R2}-90)  \quad (g)$$

In order for the inclined interface 40i to contract and the c-plane 40c to expand, $\alpha_{R2} < 90°$ is preferable. Accordingly, the second growth condition under which the inclined interface 40i is contracted and the c-plane 40c is expanded preferably satisfies the following formula (2), due to satisfying the formula (g) and $\alpha_{R2} < 90°$, $$G_{c2} < G_i/\cos \alpha  \quad (2)$$

wherein, as described above, $G_i$ represents the growth rate of the inclined interface 40i most inclined with respect to the c-plane 40c, and a represents the angle formed by the c-plane 40c and the inclined interface 40i most inclined with respect to the c-plane 40c.

Alternatively, when the growth rate of the c-plane 30c in the second layer 40 under the reference growth condition is represented by $G_{e0}$, it can also be considered that $G_{c2}$ under the second growth condition is preferably smaller than $G_{c0}$ under the reference growth condition. In this respect as well, the formula (2) can be derived by substituting the formula (a) into $G_{c2} < G_{c0}$.

Since the growth condition for contracting the inclined interface 40i most inclined with respect to the c-plane 40c is the strictest condition, when the second growth condition satisfies the formula (2), the other inclined interfaces 40i can also be contracted.

Specifically, when the inclined interface 40i most inclined with respect to the c-plane 40c is the {10-11} plane, the second growth condition preferably satisfies the following formula (2').

$$G_{c2} < 2.13 G_i  \quad (2')$$

Alternatively, for example, when the inclined interfaces 30i are {11-2m} planes satisfying m≥3, the inclined interface 30i most inclined with respect to the c-plane 30c is the {11-23} plane, and therefore, the second growth condition preferably satisfies, for example, the following formula (2").

$$G_{c2} < 1.47 G_i  \quad (2'')$$

As the second growth condition of the present embodiment, the growth temperature in the second step S300 is set higher than the growth temperature in the first step S200, for example. Specifically, the growth temperature in the second step S300 is set to 990° C. or higher and 1,120° C. or lower, and preferably 1,020° C. or higher and 1,100° C. or lower, for example.

Also, the V/III ratio in the second step S300 may be adjusted as the second growth condition of the present embodiment. For example, the V/III ratio in the second step S300 may be set lower than the V/III ratio in the first step S200. Specifically, the V/III ratio in the second step S300 is set to 1 or more and 10 or less, and preferably 1 or more and 5 or less, for example.

In practice, at least either of the growth temperature and the V/III ratio is adjusted as the second growth condition within the above-described ranges so as to satisfy the formula (2).

Other conditions of the second growth condition of the present embodiment are, for example, as follows.

Growth pressure: 90 to 105 kPa, preferably 90 to 95 kPa
Partial pressure of GaCl gas: 1.5 to 15 kPa
N₂ gas flow rate/H₂ gas flow rate: 1 to 20

Here, the second step S300 of the present embodiment is classified into two steps based on the form of the second layer 40 while growing, for example. Specifically, the second step S300 of the present embodiment includes, for example, a c-plane expansion step S320 and a main growth step S340. Through these steps, for example, a c-plane expanded layer 42 and a main growth layer 44 are formed as the second layer 40.

S320: c-plane Expansion Step

As illustrated in FIG. 6(b), the c-plane expanded layer 42 of the second layer 40 constituted by a single crystal of a group III nitride semiconductor is epitaxially grown on the first layer 30 under the above-described second growth condition.

At this time, the c-plane 40c is expanded and the inclined interfaces 40i other than the c-plane are contracted toward the upper side of the first layer 30.

Specifically, due to the growth under the second growth condition, the c-plane expanded layer 42 grows from the inclined interfaces 30i of the inclined interface maintaining layer 34 in a direction perpendicular to the c-axis (that is, a direction extending along the surface or a lateral direction) with the inclined interfaces 40i serving as growth surfaces. When the c-plane expanded layer 42 is grown laterally, the c-plane 40c of the c-plane expanded layer 42 begins to be exposed again above the peaks 30t of the inclined interface maintaining layer 34. Thus, the c-plane expanded layer 42 is formed, in which the c-plane 40c and the inclined interfaces 40i other than the c-plane coexist at the surface 40s.

When the c-plane expanded layer 42 is further grown laterally, the c-plane 40c gradually expands, and the inclined interfaces 40i of the c-plane expanded layer 42 gradually contract. Thus, the recessed portions 30p formed by the plurality of inclined interfaces 30i in the surface of the first layer 30 are gradually embedded.

Thereafter, when the c-plane expanded layer 42 is further grown, the inclined interfaces 40i of the c-plane expanded layer 42 completely disappear, and the recessed portions 30p formed by the plurality of inclined interfaces 30i in the surface of the first layer 30 are completely embedded. Thereby, the surface 40s of the c-plane expanded layer 42 becomes a mirror-finished surface (flat surface) that is constituted only by the c-plane 40c.

At this time, the dislocation density can be lowered by locally collecting dislocations during the growth process of the first layer 30 and the c-plane expanded layer 42. Specifically, the dislocations that bend and propagate in the direction inclined with respect to the c-axis in the first layer 30 continue to propagate in the same direction in the c-plane expanded layer 42. Thus, the dislocations are collected locally at a meeting part of adjacent inclined interfaces 40i above substantially the center between each pair of peaks 30t in the c-plane expanded layer 42. Out of a plurality of dislocations collected at meeting parts of adjacent inclined interfaces 40i of the c-plane expanded layer 42, dislocations that have Burgers vectors opposite to each other disappear when meeting each other. Further, some of the dislocations collected at the meeting parts of the adjacent inclined interfaces 40i form a loop, and the propagation along the c-axis (that is, toward the surface side of the c-plane expanded layer 42) is suppressed. The other dislocations of the plurality of dislocations collected at the meeting parts of the adjacent inclined interfaces 40i of the c-plane expanded layer 42 change their propagation direction again from the direction inclined with respect to the c-axis to a direction extending along the c-axis, and propagate to the surface 40s side of the second layer 40. In this way, by making some of the plurality of dislocations disappear and suppressing propagation of some of the plurality of dislocations to the surface side of the c-plane expanded layer 42, the dislocation density in the surface 40s of the second layer 40 can be made lower than the dislocation density in the base surface 5s of the base layer 5. Further, by collecting the dislocations locally, a low dislocation density region can be formed above a portion of the second layer 40 in which dislocations propagate in the direction inclined with respect to the c-axis.

Further, at this time, since the c-plane 40c gradually expands in the c-plane expanded layer 42, a second c-plane growth region 80 that grows with the c-plane 40c serving as a growth surface, which will be described later, is formed while gradually expanding toward the upper side in the thickness direction.

The second c-plane growth region 80 is a region that has grown with the c-plane 40c serving as a growth surface. In the second c-plane growth region 80, oxygen uptake is suppressed as compared with the inclined interface growth region 70. Therefore, the oxygen concentration in the second c-plane growth region 80 is lower than the oxygen concentration in the inclined interface growth region 70. The oxygen concentration in the second c-plane growth region 80 is equivalent to the oxygen concentration in the first c-plane growth region 60, for example.

On the other hand, in the c-plane expanded layer 42, as the inclined interfaces 40i gradually contract, the inclined interface growth region 70 gradually contracts toward the upper side in the thickness direction, and terminates at a predetermined position in the thickness direction. Due to the above-described growth process of the c-plane expanded layer 42, valleys 70a of the inclined interface growth region 70 are formed at positions at which the c-plane 40c is generated again, in a cross-sectional view. The plurality of valleys 70a of the inclined interface growth region 70 are respectively formed above the plurality of mountains 60b of the first c-plane growth region 60, in the cross-sectional view. Further, in the process of recessed portions formed by the inclined interfaces 40i being gradually embedded, mountains 70b of the inclined interface growth region 70 are formed at positions at which the inclined interfaces 40i disappear, in a cross-sectional view. The plurality of mountains 70b of the inclined interface growth region 70 are respectively formed above the plurality of valleys 60a of the first c-plane growth region 60, in the cross-sectional view.

When an arbitrary cross section perpendicular to the main surface 1s of the base substrate 1 is observed, an average distance between a pair of valleys 70a spaced apart from each other in a direction extending along the main surface 1s of the base substrate 1 corresponds to the above-described average distance L between closest peaks of the first layer 30, the pair of valleys 70a being closest to each other among the plurality of valleys 70a with one of the plurality of mountains 70b sandwiched between them.

Further, a plane in the second layer 40 that is substantially parallel to the main surface 1s of the base substrate 1 at an upper end of the inclined interface growth region 70 is a boundary plane 40b at a position at which the inclined interfaces 40i of the second layer 40 disappear and terminate.

In the c-plane expansion step S320, the surface of the c-plane expanded layer 42 becomes a mirror-finished surface that is constituted only by the c-plane 40c, and therefore the height of the c-plane expanded layer 42 in the thickness direction (maximum height in the thickness direction) is, for example, greater than or equal to the height from the valley 30v to the peak 30t of the inclined interface maintaining layer 34.

S340: Main Growth Step (c-Plane Growth Step)

When the inclined interfaces 40i have disappeared from the c-plane expanded layer 42 and the surface 40s has been mirror-finished, as illustrated in FIG. 7(a), the main growth layer 44 is formed on the c-plane expanded layer 42 over a predetermined thickness with the c-plane 40c serving as a growth surface. Thus, the main growth layer 44 that has only the c-plane 40c on the surface 40s without having the inclined interfaces 40i is formed.

At this time, the above-described second growth condition is maintained in the main growth step S340, similarly to the c-plane expansion step S320. Thus, step-flow growth of the main growth layer 44 can be caused with the c-plane 40c serving as a growth surface.

Further, at this time, due to the main growth layer 44 growing with only the c-plane 40c serving as a growth surface without the inclined interfaces 40i being exposed, the entire main growth layer 44 is formed as the second c-plane growth region 80, which will be described later.

In the main growth step S340, the thickness of the main growth layer 44 is set to, for example, 300 μm or more and 10 mm or less. If the thickness of the main growth layer 44 is 300 μm or more, at least one or more substrates 50 can be sliced from the main growth layer 44 in the slicing step S400, which will be described later. On the other hand, if the thickness of the main growth layer 44 is 10 mm, at least ten substrates 50 can be obtained when 700 μm-thick substrates 50 are sliced from the main growth layer 44 and a final thickness is set to 650 μm, even if a kerf loss of about 200 μm is taken into account.

Through the second step S300 described above, the second layer 40 including the c-plane expanded layer 42 and the main growth layer 44 is formed. As a result, the laminated structure 90 of the present embodiment is formed.

In the laminated structure 90, the entire surface 40s of the second layer 40 is oriented to the +c plane, and the first layer 30 and the second layer 40 each do not include a polarity reversal domain (inversion domain). In this respect, the laminated structure 90 in the second step S300 differs from a laminated structure that is formed by a so-called DEEP (Dislocation Elimination by the Epitaxial-growth with inverse-pyramidal Pits) method, that is, differs from a laminated structure including the polarity reversal domain in a core located at the center of a pit.

S380: Peeling Step

After the growth of the second layer 40 is complete, supply of HCl gas from the gas supply pipe 232a into the film formation chamber 201 is stopped. On the other hand, supply of $NH_3$ gas and exhausting of gas from the film formation chamber 201 by the pump 231 are continued.

Thereafter, in the state where supply of $NH_3$ gas and exhausting of gas from the film formation chamber 201 are continued as described above, heating of the inside of the film formation chamber 201 by the heater 207 is stopped. When the temperature inside the film formation chamber 201 has decreased to 500° C. or less, supply of $NH_3$ gas is stopped, and the atmosphere within the film formation chamber 201 is replaced with $N_2$ gas and brought back to atmospheric pressure.

Figure 7B:
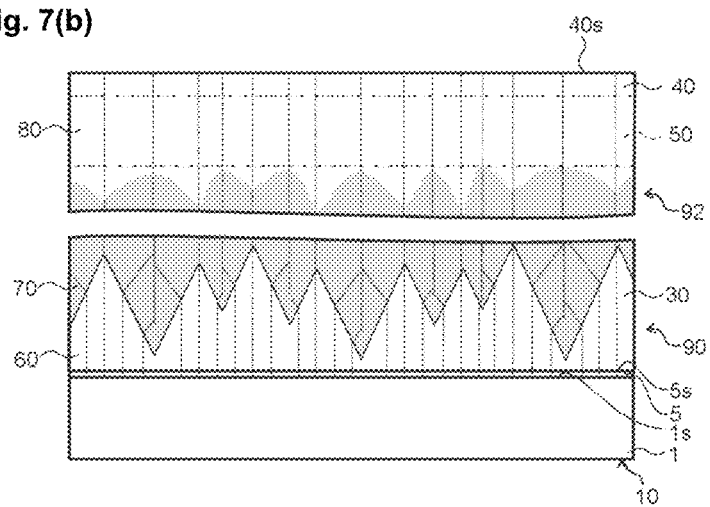

At this time, while the temperature decreases from the growth temperature of the second layer 40 after the second step S300, at least the second layer 40 spontaneously peels away from the base substrate 1 as illustrated in FIG. 7(b) due to a difference between the linear expansion coefficient of the base substrate 1 and the linear expansion coefficients of the layers above the base substrate 1. The "layers above the base substrate 1" referred to here are the buffer layer 2, the base layer 5, the first layer 30, and the second layer 40. As a result of at least the second layer 40 peeling away from the base substrate 1, a nitride semiconductor crystal 92 is formed.

At this time, the position of a peeling surface at which the second layer 40 peels away from the base substrate 1 can be adjusted by adjusting the thickness of the base substrate 1, for example.

In the present embodiment, at least the second layer 40 peels away from the peeling surface that includes the inclined interface growth region 70 of the first layer 30, for example. Accordingly, the main growth layer 44 of the second layer 40 can be peeled off without being chipped. Since the main growth layer 44 is kept from being chipped, at least one substrate 50 having a predetermined thickness can be stably sliced from the second layer 40 in the slicing step S400, which will be described later.

Note that at this time, the peeling surface may not be parallel to the main surface 1s of the base substrate 1 or the surface 40s of the main growth layer 44, depending on the manner of peeling.

Also, at this time, at least a portion of the peeled second layer 40 may split. However, it is preferable that each piece of the second layer 40 split during peeling has an area of 25 $mm^2$ or more, and preferably 100 $mm^2$ or more, for example. A semiconductor device such as a high-output LED has a chip size of 600 μm or more and 1 mm or less, and accordingly, it is possible to obtain at least 25 semiconductor devices, and preferably 100 semiconductor devices from each piece of the second layer 40, for example.

At this time, a portion of the laminated structure 90 that is left on the base substrate 1 side, that is, a portion of the laminated structure 90 that includes the base substrate 1 and a remaining layer of at least either of the first layer 30 and the base layer 5 is convex toward the remaining layer side due to a linear expansion coefficient difference between the base substrate 1 and the remaining layer. In contrast, the second layer 40 is not warped because stress is released from the second layer 40 peeled in the peeling step S380. Therefore, the c-plane 40c of the second layer 40 peeled in the peeling step S380 can have a larger radius of curvature than the c-plane of the remaining layer of at least either of the first layer 30 and the base layer 5, for example.

Specifically, the c-plane 40c of the second layer 40 peeled in the peeling step S380 can have a radius of curvature of 5 m or more, and preferably 10 m or more, for example.

After the second layer 40 was peeled off as described above, when the temperature inside the film formation chamber 201 has decreased to a temperature at which the laminated structure 90 and the like can be taken out, the peeled second layer 40 and the portion of the laminated structure 90 left on the base substrate 1 side are taken out from the film formation chamber 201.

In the present embodiment, steps from the template forming step S100 to the peeling step S380 described above are successively performed in the same vapor phase growth apparatus 200 without the template 10 being exposed to ambient air. Thus, it is possible to suppress unintended formation of a high oxygen concentration region (a region having an oxygen concentration that is excessively higher than that of the inclined interface growth region 70) at an interface between the buffer layer 2 and the base layer 5, an interface between the base layer 5 and the first layer 30, and an interface between the first layer 30 and the second layer 40.

S400: Slicing Step

Next, as illustrated in FIG. 7(b), for example, the main growth layer 44 is sliced using a wire saw along a cut surface (dash-dot line) that is substantially parallel to the surface of the main growth layer 44. Thus, at least one nitride semiconductor substrate 50 (also referred to as a substrate 50) as an as-sliced substrate is formed. At this time, the thickness of the substrate 50 is, for example, 300 µm or more and 700 µm or less.

S500: Polishing Step

Next, both sides of the substrate 50 are polished using a polishing device. At this time, the thickness of the final substrate 50 is, for example, 250 µm or more and 650 µm or less.

When the second layer 40 splits while peeling, a step for shaping the substrate 50 (external shape thereof) may be performed before or after polishing the substrate 50.

The substrate 50 according to the present embodiment is manufactured through the above steps S100 to S500.

Step of manufacturing semiconductor laminate and step of manufacturing semiconductor device After the substrate 50 is manufactured, for example, a semiconductor functional layer that is constituted by a group III nitride semiconductor is epitaxially grown on the substrate 50 to manufacture a semiconductor laminate. After the semiconductor laminate is manufactured, an electrode or the like is formed using the semiconductor laminate, and the semiconductor laminate is diced, and a chip having a predetermined size is cut out. Thus, a semiconductor device is manufactured.

(2) Nitride Semiconductor Crystal

Next, the nitride semiconductor crystal 92 according to the present embodiment will be described using FIG. 7(*b*).

In the present embodiment, the nitride semiconductor crystal 92 obtained using the manufacturing method described above is constituted by at least the second layer 40 peeled away from the base substrate 1, for example.

The nitride semiconductor crystal 92 of the present embodiment has a trace (hereinafter referred to as a "peeling trace") that was made when at least the second layer 40 peeled away from the base substrate 1, for example.

For example, the nitride semiconductor crystal 92 has the peeling surface on the side opposite to the surface 40*s* of the main growth layer 44, as the peeling trace. As described above, the peeling surface of the nitride semiconductor crystal 92 may not be parallel to the surface 40*s* of the main growth layer 44, depending on the manner of peeling. In this case, the peeling surface may be inclined with respect to the surface 40*s* of the main growth layer 44, curved, or wavy, for example, so long as the peeling surface does not excessively enter the second layer 40. Alternatively, the peeling surface may have stripes that are concentric about the center of the base substrate 1 in a plan view, for example.

Also, the nitride semiconductor crystal 92 may have a split surface that is formed as a result of at least a portion of the peeled second layer 40 splitting, as the peeling trace, for example. The split surface may be formed along a direction that forms an angle of 10° or less, and preferably 5° or less with respect to either the a-axis direction or the m-axis direction, but does not necessarily have to be formed along such a direction.

Also, the nitride semiconductor crystal 92 may include at least some of the buffer layer 2, the base layer 5, and the first layer 30 on the side opposite to the surface 40*s* of the main growth layer 44, as the peeling trace, for example.

In the present embodiment, at least the second layer 40 peels away from the peeling surface that includes the inclined interface growth region 70 of the first layer 30, and accordingly, the nitride semiconductor crystal 92 includes at least a portion of the inclined interface growth region 70 on the side opposite to the surface 40*s* of the main growth layer 44. In this case, the inclined interface growth region 70 included in the nitride semiconductor crystal 92 may be discretely distributed along the surface 40*s* of the main growth layer 44, for example.

(3) Nitride Semiconductor Substrate (Nitride Semiconductor Free-Standing Substrate, Nitride Crystal Substrate)

Figure 10A:
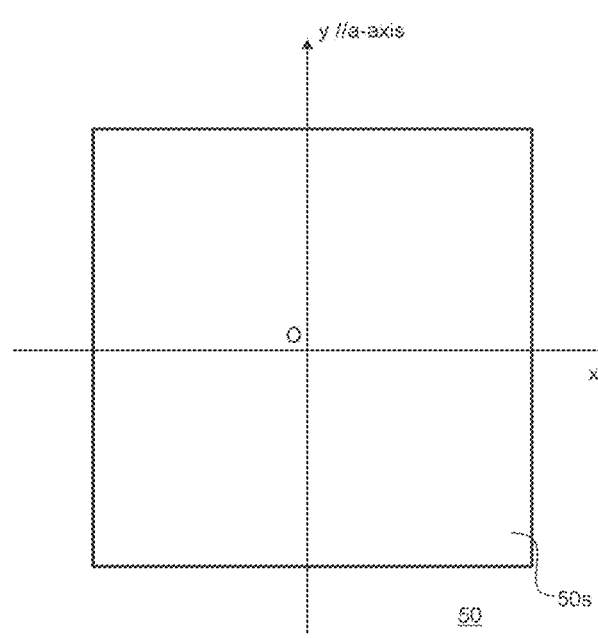
FIG. 10(a) is a schematic top view illustrating a nitride semiconductor substrate according to the first embodiment of the present disclosure.
Figure 10C:
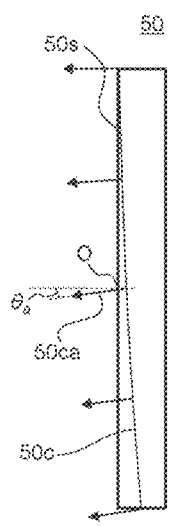
FIG. 10(c) is a schematic cross-sectional view taken along an a-axis of the nitride semiconductor substrate according to the first embodiment of the present disclosure.
Figure 10B:
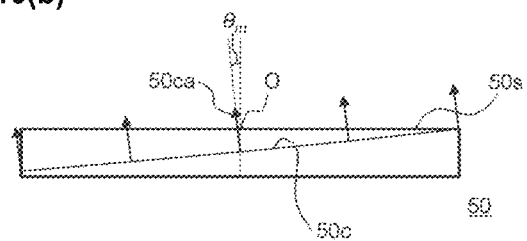
FIG. 10(b) is a schematic cross-sectional view taken along an m-axis of the nitride semiconductor substrate according to the first embodiment of the present disclosure.

Next, the nitride semiconductor substrate 50 according to the present embodiment will be described with reference to FIGS. 10(*a*) to 10(*c*). FIG. 10(*a*) is a schematic top view illustrating the nitride semiconductor substrate according to the present embodiment, FIG. 10(*b*) is a schematic cross-sectional view taken along the maxis of the nitride semiconductor substrate according to the present embodiment, and FIG. 10(*c*) is a schematic cross-sectional view taken along the a-axis of the nitride semiconductor substrate according to the present embodiment.

In the present embodiment, the substrate 50 obtained from the second layer 40 peeled away from the base substrate 1 by the above-described manufacturing method is a free-standing substrate that is constituted by a single crystal of a group III nitride semiconductor, for example. In the present embodiment, the substrate 50 is a GaN free-standing substrate, for example.

The substrate 50 has a thickness of 300 µm or more and 1 mm or less, for example.

The substrate 50 has a main surface 50*s*, which serves an epitaxial growth surface, for example. In the present embodiment, a low index crystal plane that is closest to the main surface 50*s* is a c-plane 50*c* (+c plane), for example.

The main surface 50*s* of the substrate 50 is mirror-finished, for example, and a root mean square roughness RMS of the main surface 50*s* of the substrate 50 is less than 1 nm, for example.

The substrate 50 is obtained from a piece of the second layer 40 split in the peeling step S380 described above, for example. The substrate 50 can have a suitable external shape, for example, a polygonal shape or a circular shape.

The area of the main surface 50*s* of the substrate 50 is 25 mm$^2$ or more, and preferably 100 mm$^2$ or more, for example. In a case where the second layer 40 does not split in the peeling step S380 described above, an upper limit value of the area of the main surface 50*s* of the substrate 50 is equivalent to the area of the main surface 1*s* of the base substrate 1.

The conductivity of the substrate 50 is not particularly limited, but when manufacturing a semiconductor device as a vertical Schottky barrier diode (SBD) using the substrate 50, the substrate 50 is n-type, for example, an n-type impurity in the substrate 50 is Si or germanium (Ge), for example, and the concentration of the n-type impurity in the substrate 50 is $1.0 \times 10^{18}$ cm$^{-3}$ or more and $1.0 \times 10^{20}$ cm$^{-3}$ or less, for example.

Further, in the present embodiment, the impurity concentration in the substrate 50 obtained using the above-described manufacturing method is lower than that of a substrate obtained using a flux method, an ammonothermal method, or the like.

Specifically, a hydrogen concentration in the substrate 50 is less than $1 \times 10^{17}$ cm$^{-3}$, and preferably $5 \times 10^{16}$ cm$^{-3}$ or less, for example.

Further, in the present embodiment, the substrate 50 is formed by slicing the main growth layer 44 grown with the c-plane 40*c* serving as a growth surface, and accordingly, does not include the inclined interface growth region 70 grown with the inclined interfaces 30*i* or the inclined interfaces 40*i* serving as growth surfaces. That is, the entire substrate 50 is constituted by a low oxygen concentration region.

Specifically, the oxygen concentration in the substrate 50 is $5 \times 10^{16}$ cm$^{-3}$ or less, and preferably $3 \times 10^{16}$ cm$^{-3}$ or less, for example.

Further, in the present embodiment, the substrate 50 does not include, for example, the polarity reversal domain (inversion domain) as described above.

Curvature of c-Plane

As illustrated in FIGS. 10(*b*) and 10(*c*), in the present embodiment, the c-plane 50*c*, which is the low index crystal plane closest to the main surface 50*s* of the substrate 50, is curved in a convex or concave spherical shape with respect to the main surface 50*s*, for example.

In the present embodiment, the c-plane 50*c* of the substrate 50 has, for example, a curved surface that approximates to a spherical surface in each of a cross section taken along the m-axis and a cross section taken along the a-axis.

In the present embodiment, since the c-plane 50*f* of the substrate 50 is curved like a convex or concave spherical surface as described above, at least a part of the c-axis 50*ca* is inclined with respect to the normal of the main surface 50*s*. The off-angle θ, which is the angle formed by the c-axis 50*ca* with respect to the normal of the main surface 50*s*, has a predetermined distribution within the main surface 50*s*.

In the off-angle θ formed by the c-axis 50*ca* with respect to the normal of the main surface 50*s*, a directional component extending along the m-axis is represented by $\theta_m$, and a directional component extending along the a-axis is represented by $\theta_a$. $\theta^2 = \theta_m^2 + \theta_a^2$ is satisfied.

In the present embodiment, since the c-plane 50*c* of the substrate 50 is curved like a convex or concave spherical surface as described above, the off-angle m-axis component $\theta_m$ and the off-angle a-axis component $\theta_a$ can be approximately represented by a linear function of x and a linear function of y, respectively.

In the present embodiment, the second layer 40 peels away from the base substrate 1 in the peeling step S380 described above, and accordingly, strain caused by lattice mismatch with the base substrate 1, and compression stress due to a linear expansion coefficient difference from the base substrate 1 are not applied to the substrate 50 obtained from the second layer 40. Therefore, as described above, the radius of curvature (absolute value thereof) of the c-plane 50*c* of the substrate 50 is larger than that of the remaining layer that is left on the base substrate 1 side in the peeling step S380, for example.

Specifically, the radius of curvature (absolute value thereof) of the c-plane 50*c* of the substrate 50 is 5 m or more, and preferably 10 m or more, for example.

In the present embodiment, an upper limit of the radius of curvature of the c-plane 50*c* of the substrate 50 is not particularly limited, because the larger, the better. When the c-plane 50*c* of the substrate 50 is substantially flat, the radius of curvature of the c-plane 50*c* can be considered infinite.

Further, in the present embodiment, since the curvature of the c-plane 50*c* becomes isotropically small with respect to the main surface 50*s* of the substrate 50, the absolute value of the radius of curvature of the c-plane 50*c* has little dependence on directions.

Specifically, a difference between the absolute value of a radius of curvature of the c-plane 50*c* in a direction extending along the a-axis and the absolute value of a radius of curvature of the c-plane 50*c* in a direction extending along the m-axis is 90% or less, preferably 50% or less, more preferably 20% or less, and further preferably 10% or less of the absolute value of the larger radius of curvature, for example.

Dark Spots

Next, dark spots on the main surface 50*s* of the substrate 50 of the present embodiment will be described. The "dark spots" referred to herein means points at which the light emission intensity is low in an observation image of the main surface 50*s* observed using a multiphoton excitation microscope, a cathode luminescence image of the main surface 50*s*, or the like, and includes not only dislocations but also non-light-emissive centers due to foreign matters or point defects. The "multiphoton excitation microscope" is sometimes referred to as a two-photon excitation fluorescence microscope.

In the present embodiment, since the substrate 50 is manufactured from the second layer 40 that is formed through the steps consistently performed in the vapor phase growth apparatus 200, there are few non-light-emissive centers due to foreign matters or point defects in the substrate 50. Therefore, when the main surface of the substrate 50 is observed using a multiphoton excitation microscope or the like, 95% or more, and preferably 99% or more of the dark spots are dislocations rather than non-light-emissive centers due to foreign matters or point defects.

Further, in the present embodiment, owing to the above-described manufacturing method, the dislocation density in the surface of the second layer 40 is lower than the dislocation density in the base surface 5*s* of the base layer 5. Accordingly, dislocations are also reduced in the main surface 50*s* of the substrate 50 formed by slicing the second layer 40.

Further, in the present embodiment, the first step S200 and the second step S300 are performed in the above-described manufacturing method by using the unprocessed template 10, and therefore, regions having high dislocation density are not formed as a result of dislocations being concentrated due to processing, and regions having low dislocation density are randomly formed in the main surface 50*s* of the substrate 50 formed by slicing the second layer 40.

Specifically, in the present embodiment, when a dislocation density is determined from a dark spot density by observing the main surface 50*s* of the substrate 50 using the multiphoton excitation microscope in a field of view of 250 µm square, there is no region that has a dislocation density higher than $5 \times 10^6$ cm$^{-2}$.

In other words, in the present embodiment, a dislocation density determined by averaging the entire main surface 50*s* of the substrate 50 is $5 \times 10^6$ cm$^{-2}$ or less, and preferably less than $3 \times 10^6$ cm$^{-2}$, for example.

Figure 11:
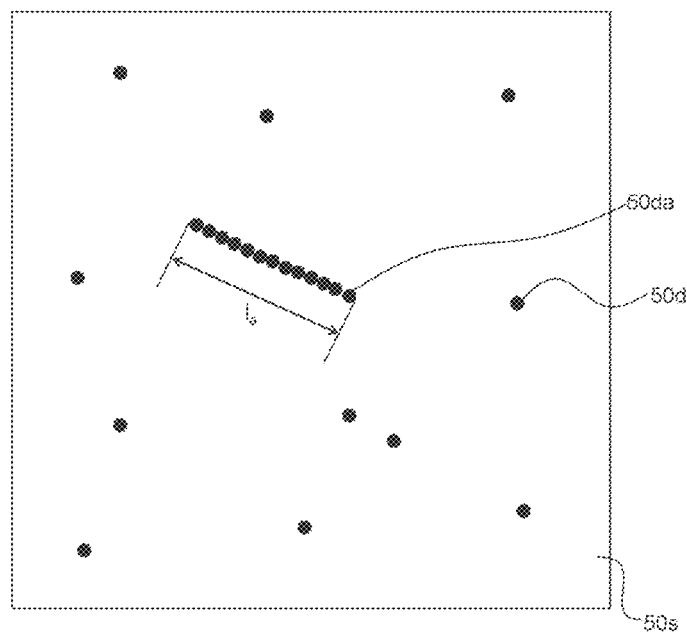
FIG. 11 is a schematic diagram showing an enlarged observation image obtained by observing a main surface of the nitride semiconductor substrate according to the first embodiment of the present disclosure using a multiphoton excitation microscope.

Here, a dislocation distribution in the main surface 50*s* of the substrate 50 of the present embodiment will be described using FIG. 11. FIG. 11 is a schematic diagram showing an enlarged observation image obtained by observing the main surface of the nitride semiconductor substrate according to the present embodiment using a multiphoton excitation microscope.

As illustrated in FIG. 11, the main surface 50*s* of the substrate 50 of the present embodiment includes a plurality of dislocation arrays 50*da*, for example. The "dislocation array 50*da*" referred to here means a set (group) of at least three dislocations that are arranged at intervals of 1 µm or less along a predetermined direction, for example. Here, a dislocation array 50*da* that satisfies the above definition is counted as a single array, irrespective of the number of dislocations 50*d* constituting the dislocation array 50*da* and the length of the dislocation array 50*da*.

The plurality of dislocation arrays 50*da* in the main surface 50*s* of the substrate 50 of the present embodiment include paraxial dislocation arrays each extending along a direction that forms an angle of 10° or less, and preferably 5° or less with respect to the a-axis direction or the m-axis direction, for example. The direction in which the paraxial dislocation arrays extend in a plan view substantially matches either of the direction in which ridges of the recessed portions 30p extend and the direction of the normal of the inclined interfaces 30i forming the recessed portions 30p, for example.

The main surface 50s of the substrate 50 may include dislocation arrays that do not extend along a direction that forms an angle of 10° or less with respect the a-axis direction or the m-axis direction. In such a case, 80% or more, or preferably 90% or more of all dislocation arrays are the paraxial dislocation arrays extending along a direction forming an angle of 10° or less, and preferably 5° or less with respect to the a-axis direction or the m-axis direction.

In the present embodiment, as a result of the dislocations being locally collected by the manufacturing method described above, dislocations that have Burgers vectors opposite to each other disappear, and some of the locally collected dislocations form a loop. Thus, the number of dislocations 50d can be reduced in the main surface 50s of the substrate 50 obtained from the second layer 40. As a result, even when there are dislocation arrays 50da in the main surface 50s of the substrate 50, the number of dislocation arrays 50da is small.

Specifically, the density of the dislocation arrays 50da in the main surface 50s of the substrate 50 of the present embodiment is $1 \times 10^6$ arrays/cm$^2$ or less, preferably $1 \times 10^5$ arrays/cm$^2$ or less, and more preferably $8 \times 10^4$ arrays/cm$^2$ or less, for example. If the density of the dislocation arrays 50da is higher than $1 \times 10^6$ arrays/cm$^2$, current leakage may occur due to the dislocation arrays 50da or non-light-emissive centers may be formed due to the dislocation arrays 50da when a semiconductor device is manufactured using the substrate 50. In contrast, in the present embodiment, the density of the dislocation arrays 50da is $1 \times 10^6$ arrays/cm$^2$ or less, and therefore, it is possible to suppress occurrence of current leakage due to the dislocation arrays 50da and generation of non-light-emissive centers due to the dislocation arrays 50da when a semiconductor device is manufactured using the substrate 50. Furthermore, when the density of the dislocation arrays 50da is $1 \times 10^5$ arrays/cm$^2$ or less, occurrence of the above-described defects can be stably suppressed. Furthermore, when the density of the dislocation arrays 50da is $8 \times 10^4$ arrays/cm$^2$ or less, occurrence of the above-described defects can be more stably suppressed.

A lower limit value of the density of the dislocation arrays 50da is not particularly limited, because the smaller, the better. However, it is difficult to completely eliminate the dislocation arrays 50da using the manufacturing method in which the base substrate 1 that is a dissimilar substrate is used, and therefore, the lower limit value of the density of the dislocation arrays 50da is $1 \times 10^2$ arrays/cm$^2$, for example.

The array length la of each paraxial dislocation array in the main surface 50s of the substrate 50 of the present embodiment is shorter than that of a dislocation array that is formed by the ELO method, and is 100 μm or less, for example. If the array length la of each paraxial dislocation array is longer than 100 μm, a proportion of the paraxial dislocation arrays is likely to be high in a semiconductor device that is cut out from the substrate 50. In contrast, in the present embodiment, the array length la of each paraxial dislocation array is 100 μm or less, and therefore, the proportion of the paraxial dislocation arrays can be kept from being high in a semiconductor device that is cut out from the substrate 50.

A lower limit value of the array length la of each paraxial dislocation array is not particularly limited, because the shorter, the better. However, in view of the above definition of the dislocation arrays 50da, the lower limit value of the array length la of each paraxial dislocation array is 2 μm, for example.

Full Width at Half Maximum in X-ray Rocking Curve Measurement

As described above, the main surface 10s of the substrate 50 of the present embodiment has few dislocations and good crystal quality factors.

As a result, when X-ray rocking curve measurement of (0002) plane diffraction is performed on the substrate 50 of the present embodiment, the full width at half maximum (FWHM) is 100 arcsec or less, and preferably 80 arcsec or less, for example. The width of an incident side slit in the ω direction is 0.1 mm.

Further, in the present embodiment, the number of dislocations is small and the crystal quality factors are good over a wide range of the main surface 50s of the substrate 50.

As a result, when the X-ray rocking curve measurement of the (0002) plane diffraction is performed at a plurality of measurement points that are set at 5 mm intervals within the main surface 50s of the substrate 50 of the present embodiment, the full width at half maximum of the (0002) plane diffraction is 100 arcsec or less, or preferably 80 arcsec or less at 90% or more of all the measurement points, for example.

(4) Effects Achieved by the Present Embodiment

According to the present embodiment, one or more of the following effects can be achieved.

(a) After the template forming step S100, the first layer 30 is three-dimensionally grown on the template 10 in the first step S200, and therefore, even when the second layer 40 is grown on the first layer 30 to be thick enough to stably obtain the substrate 50, generation of cracks in the layers (epilayers) above the base substrate 1 can be suppressed during the growth of the second layer 40. It is thought that the structure of the three-dimensionally grown first layer 30 has an effect of mitigating stress (strain).

(b) In the first step S200, the inclined interfaces 30i other than the c-plane are generated in the surface of the single crystal constituting the first layer 30, and therefore, it is possible to bend dislocations and make the dislocations propagate in a direction that is substantially perpendicular to the inclined interfaces 30i at positions where the inclined interfaces 30i are exposed. Thus, the dislocations can be locally collected. As a result of the dislocations being locally collected, dislocations that have Burgers vectors opposite to each other disappear. Alternatively, as a result of the locally collected dislocations forming a loop, the dislocations can be kept from propagating to the surface side of the second layer 40. Thus, the dislocation density in the surface of the second layer 40 can be lowered. As a result, it is possible to obtain the substrate 50 that has a lower dislocation density than the base layer 5 of the template 10.

(c) In the peeling step S380 performed after the second step S300, while the temperature decreases from the growth temperature of the second layer 40, at least the second layer 40 spontaneously peels away from the base substrate 1 due to a difference between the linear expansion coefficient of the base substrate 1 and the linear expansion coefficients of the layers above the base substrate 1. Therefore, at least the second layer 40 can stand on its own in a state where compression stress due to the linear expansion coefficient difference between the base substrate 1 and the epilayers is not applied to the second layer 40 (i.e., in an unwarped state). As a result, the substrate 50 can be easily obtained from the peeled second layer 40.

For the reasons described above in (a) to (c), it is possible to easily obtain the substrate 50 of which the dislocation density is reduced and that has good crystal quality.

For reference, a so-called VAS (Void-Assisted Separation) method is known as a method for manufacturing a high-quality nitride semiconductor substrate. Steps for manufacturing the nitride semiconductor substrate using the VAS method include a first crystal layer forming step, a metal layer forming step, a void-forming annealing step, a second crystal layer forming step, a peeling step, and a slicing step, for example. That is, the VAS method includes many manufacturing steps.

In contrast, in the present embodiment, the first crystal layer forming step need not be performed using another apparatus. Also, the metal layer forming step and the void-forming annealing step can be eliminated. Therefore, the manufacturing steps can be simplified. On the other hand, the dislocation density in the main surface 50s of the substrate 50 obtained in the present embodiment is almost equivalent to that achieved in the VAS method. That is, according to the present embodiment, it is possible to simplify the manufacturing steps while manufacturing the substrate 50 that has high quality.

(d) By forming the base layer 5 having the mirror-finished base surface 5s over the entire main surface 1s of the base substrate 1 in the template forming step S100 that is performed before the first step S200, it is possible to make the inclined interfaces 30i appear substantially uniformly in a plane of the first layer 30 in the first step S200. Specifically, the distance between closest peaks of the first layer 30 can be made uniform in the plane, for example. As a result, the dislocation density can be lowered over the entire surface of the second layer 40.

(e) In the initial stage of the first step S200 in which the expanded inclined interface layer 32 grows, the expanded inclined interface layer 32 is two-dimensionally grown to a predetermined thickness with the c-plane 30c serving as the growth surface, and thereafter the plurality of recessed portions 30p are generated in the top surface 30u of the expanded inclined interface layer 32. In other words, the expanded inclined interface layer 32 (initial layer) that has a mirror-finished surface is formed so as to have the predetermined thickness before the expanded inclined interface layer 32 starts to three-dimensionally grow. Thus, it is possible to make the inclined interfaces 30i uniformly appear in a plane of the first layer 30 in the first step S200. As a result, the dislocation density can be lowered over the entire surface of the second layer 40.

Furthermore, the crystal axis can be made uniform over the entire base surface 5s of the base layer 5 as a result of the plurality of recessed portions 30p being generated in the top surface 30u of the expanded inclined interface layer 32 after the expanded inclined interface layer 32 is two-dimensionally grown so as to have the predetermined thickness with the c-plane 30c serving as the growth surface in the initial stage of the first step S200. Thus, it is possible to suppress generation of new dislocations due to misalignment between crystal axes. As a result, it is possible to lower the dislocation density and the density of dislocation arrays and reduce the array length of each dislocation array.

For reference, the following considers a case where an amorphous buffer layer is gown on the base layer at a low temperature, and thereafter an epilayer is three-dimensionally grown by raising the temperature. In this case, the buffer layer changes from the amorphous layer to a polycrystal while the temperature is raised to a growth temperature of the epilayer. In the following growth of the epilayer, the epilayer grows in the manner of islands on the polycrystal buffer layer. Crystal axes of crystals that are grown in the manner of islands on the polycrystal vary from each other. Therefore, when the island-like crystals further grow and meet each other, new dislocations are generated due to misalignment between crystal axes. As a result, the dislocation density and the density of dislocation arrays may be high in the epilayer, and a long dislocation array may be generated in the epilayer.

(f) In the first step S200, the c-plane 30c disappears from the top surface 30u of the first layer 30. Thereby, the plurality of valleys 30v and the plurality of peaks 30t can be formed in the surface of the first layer 30. As a result, the dislocations propagated from the base layer 5 of the template 10 can be reliably bent at positions where the inclined interfaces 30i in the first layer 30 are exposed.

Here, a case where the c-plane remains in the first step will be considered. In this case, in portions where the c-plane remains, the dislocations propagated from the base substrate propagate substantially vertically upward without being bent and reach the surface of the second layer. Therefore, the dislocations are not reduced and high dislocation density regions are formed above the portions where the c-plane remains.

In contrast, according to the present embodiment, since the c-plane 30c disappears from the top surface 30u of the first layer 30 in the first step S200, the surface of the first layer 30 can be constituted only by the inclined interfaces 30i other than the c-plane, and the plurality of valleys 30v and the plurality of peaks 30t can be formed in the surface of the first layer 30. Thereby, the dislocations propagated from the base layer 5 of the template 10 can be reliably bent over the entire surface of the first layer 30. Since the dislocations are reliably bent, some of the plurality of dislocations are likely to disappear, or some of the plurality of dislocations are unlikely to propagate to the surface side of the second layer 40. As a result, the dislocation density can be lowered over the entire main surface 1s of the substrate 50 obtained from the second layer 40.

(g) In the first step S200, after the c-plane 30c disappears from the surface of the first layer 30, the growth of the first layer 30 is continued over a predetermined thickness while a state where the surface is constituted only by the inclined interfaces 30i is maintained. Thus, it is possible to make sure that the c-plane 30c disappears over the entire surface of the first layer 30. For example, even if the timing at which the c-plane 30c disappears from the surface of the first layer 30 in the inclined interface expansion step S220 shifts and the c-plane 30c partially remains in the expanded inclined interface layer 32, it is possible to make sure that the c-plane 30c disappears.

Further, a sufficient time can be secured to bend the dislocations at positions where the inclined interfaces 30i are exposed, by continuing the growth of the first layer 30 at the inclined interfaces 30i after the c-plane 30c disappears. Here, if the c-plane is grown immediately after disappearing, there is a possibility of the dislocations not being sufficiently bent and propagating in the substantially vertical direction toward the surface of the second layer. In contrast, according to the present embodiment, since sufficient time is secured to bend the dislocations at positions where the inclined interfaces 30i other than the c-plane are exposed, particularly, dislocations near the peaks 30t of the first layer 30 can be reliably bent, and the dislocations can be kept from propagating in the substantially vertical direction from the base layer 5 of the template 10 toward the surface of the second layer 40. Thus, concentration of the dislocations above the peaks 30t of the first layer 30 can be suppressed.

(h) At least the second layer 40 spontaneously peels away from the base substrate 1 in the peeling step S380, and therefore, it is possible to release stress from the peeled second layer 40 and suppress warpage of the second layer 40. As a result, the c-plane 40c of the second layer 40 peeled in the peeling step S380 can have a larger radius of curvature than the c-plane of the remaining layer of at least either of the first layer 30 and the base layer 5, for example. Specifically, the c-plane 40c of the peeled second layer 40 can have a radius of curvature of 5 m or more, for example.

Second Embodiment of the Present Disclosure

Next, a second embodiment of the present disclosure will be described.

In the first embodiment described above, an explanation is given for the case where the sapphire substrate is used as the base substrate 1, but the present disclosure is not limited to this case. The base substrate 1 may be changed as in the present embodiment described below. The present embodiment differs from the first embodiment described above in the base substrate 1 and steps relating to the base substrate 1.

The following only describes elements that differ from those in the above-described embodiment, and elements that are substantially the same as those in the above-described embodiment are denoted with the same reference signs as those used in the above-described embodiment, and descriptions thereof are omitted.

(1) Method for Manufacturing a Nitride Semiconductor Substrate

Figure 12A:
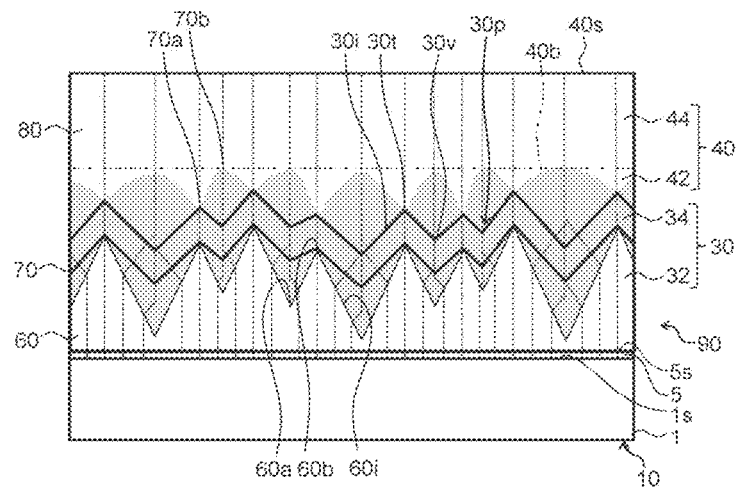
FIGS. 12(a) and 12(b) are schematic cross-sectional views illustrating a part of a method for manufacturing a nitride semiconductor substrate according to a second embodiment of the present disclosure.
Figure 12B:
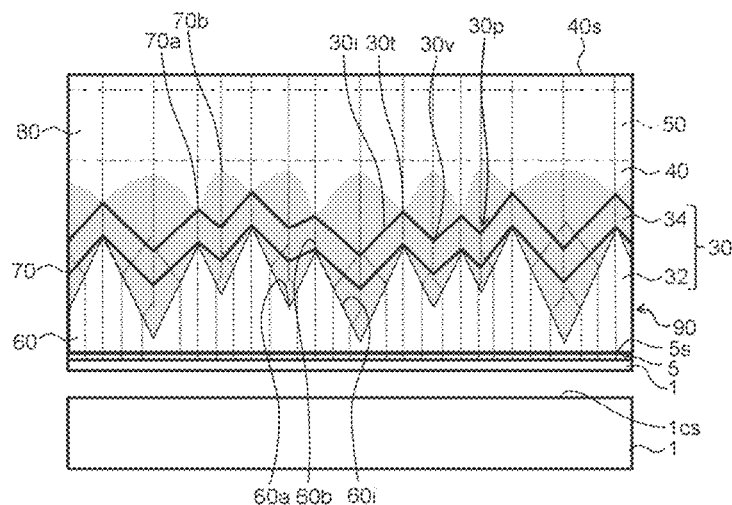

A method for manufacturing a nitride semiconductor substrate of the present embodiment will be described replacing FIG. 7 of the first embodiment described above with FIG. 12. FIGS. 12(a) and 12(b) are schematic cross-sectional views showing a part of the method for manufacturing a nitride semiconductor substrate according to the present embodiment.

S120: Base Substrate Preparation Step

In the present embodiment, a substrate that is constituted by a single crystal represented by a composition formula $RAO_3(MO)_n$ (hereinafter also referred to as a "$RAO_3(MO)_n$ substrate") is prepared as the base substrate 1. In the composition formula, R represents a trivalent element that is at least any one of Sc, In, Y, and a lanthanoid series element, A represents a trivalent element that is at least any one of Fe(III), Ga, and Al, M represents a divalent element that is at least any one of Mg, Mn, Fe(II), Co, Cu, Zn, and Cd, and n represents an integer greater than or equal to 1.

$RAMO_4$ (n=1) has a $YbFe_2O_4$ structure. $RAO_3(MO)_n$ (n≥2) has an $InFeO_3(ZnO)_n$ structure. These single crystals are configured in the form of mica. Accordingly, these single crystals can be cleaved along the (0001) plane.

In the present embodiment, the (0001) plane is the low index crystal plane that is closest to the main surface 1s of the base substrate 1, for example. Therefore, the base substrate 1 can be cleaved along a cleavage surface that extends along the main surface 1s. The <0001> axis of the base substrate 1 may be inclined at a predetermined off-angle with respect to the normal of the main surface 1s.

In the present embodiment, the base substrate 1 is preferably a substrate that is constituted by a single crystal of $ScAlMgO_4$, for example.

The absolute value of a lattice mismatch ratio between $ScAlMgO_4$ and GaN {(lattice constant of GaN-lattice constant of $ScAlMgO_4$)/lattice constant of GaN}×100 is smaller than the absolute value of a lattice mismatch ratio between sapphire and GaN, and is about 1.9%. Therefore, it is possible to suppress occurrence of crystal strain due to lattice mismatch between the base substrate 1 and a nitride semiconductor layer.

Also, the absolute value of a linear expansion coefficient mismatch ratio between $ScAlMgO_4$ and GaN {(thermal expansion coefficient of GaN-thermal expansion coefficient of $ScAlMgO_4$)/thermal expansion coefficient of GaN}×100 is smaller than the absolute value of a linear expansion coefficient mismatch ratio between sapphire and GaN, and is about 10.9%. Therefore, it is possible to suppress generation of excessive thermal stress when the temperature decreases from a crystal growth temperature of a nitride semiconductor.

S140 to S300

After the base substrate 1 is prepared, the steps from the buffer layer forming step S140 to the second step S300 are performed similarly to the first embodiment described above.

As a result, a laminated structure 90 of the present embodiment is formed as illustrated in FIG. 12(a).

S380: Peeling Step

After the formation of the laminated structure 90 is complete, as illustrated in FIG. 12(b), the base substrate 1 is cleaved along the (0001) plane of the base substrate 1, which serves as a cleavage surface 1cs extending along the main surface 1s of the base substrate 1, using the cleavability of the mica-like base substrate 1.

At this time, in the present embodiment, while the temperature decreases from the growth temperature of the second layer 40 after the second step S300, the base substrate 1 is spontaneously cleaved due to a difference between the linear expansion coefficient of the base substrate 1 and the linear expansion coefficients of the layers above the base substrate 1.

As described above, the linear expansion coefficient mismatch ratio between $ScAlMgO_4$, which is the base substrate 1, and GaN is small. Therefore, even when the temperature decreases from the growth temperature of the second layer 40 to normal temperature, thermal stress required for the cleavage may not be generated between the base substrate 1 and the layers above the base substrate 1. Consequently, the base substrate 1 may not spontaneously cleave. However, in such a case, the base substrate 1 may be cleaved from a notch that is formed in a side portion of the base substrate 1 by serving the notch as a starting point, after the temperature has decreased to normal temperature. The notch may be formed in the base substrate 1 in the base substrate preparation step S120 or after the temperature has decreased to normal temperature after the second step S300.

As a result of the base substrate 1 being cleaved with the (0001) plane of the base substrate 1 serving as the cleavage surface 1cs as described above, a portion of the base substrate 1 above the cleavage surface 1cs is separated as a sacrificial layer from a portion of the base substrate 1 below the cleavage surface 1cs. Thus, the laminated structure 90 that includes the portion (i.e., the sacrificial layer) of the base substrate 1 above the cleavage surface 1cs, the base layer 5, the first layer 30, and the second layer 40 can be peeled off from the portion of the base substrate 1 below the cleavage surface 1cs.

S400: Slicing Step

Next, as illustrated in FIG. 12(b), the main growth layer 44 in the peeled laminated structure 90 is sliced using a wire saw along a cut surface (dash-dot line) that is substantially parallel to the surface of the main growth layer 44, for example. Thus, at least one substrate 50 is formed as an as-sliced substrate.

At this time, stress is applied to the laminated structure 90 including the portion of the base substrate 1 above the cleavage surface 1cs, the base layer 5, the first layer 30, and the second layer 40 due to a linear expansion coefficient difference between these layers. In contrast, the stress is released from the substrate 50 that is formed by slicing the main growth layer 44. Therefore, the c-plane 50c of the substrate 50 formed in the slicing step S400 can have a larger radius of curvature than the c-plane of the remaining layer of at least either of the first layer 30 and the base layer 5, for example.

Specifically, the c-plane 50c of the substrate 50 can have a radius of curvature of 5 m or more, and preferably 10 m or more, for example.

S500: Polishing Step

Next, both sides of the substrate 50 are polished using a polishing device.

The substrate 50 according to the present embodiment is manufactured through the above steps S100 to S500.

The substrate 50 according to the present embodiment can have characteristics that are similar to those achieved in the first embodiment described above.

(2) Effects Achieved by the Present Embodiment (a) The $RAO_3(MO)_n$ substrate configured in the form of mica is used as the base substrate 1. Accordingly, the base substrate 1 can be cleaved using the cleavability of the mica-like base substrate 1, with the (0001) plane of the base substrate 1 serving as the cleavage surface 1cs extending along the main surface 1s of the base substrate 1.

(b) The base substrate 1 is cleaved along the main surface 1s in the peeling step S380, and therefore, it is possible to keep complex stress from being applied to the second layer 40 for obtaining the substrate 50. Thus, it is possible to suppress the generation of cracks at least in the second layer 40.

(c) In the peeling step S380, the base substrate 1 is cleaved along the cleavage surface 1cs that extends along the main surface 1s, and therefore, it is possible to keep the peeling surface from entering the second layer 40 for obtaining the substrate 50. Accordingly, the main growth layer 44 of the second layer 40 can be stably peeled off without being chipped. Since the main growth layer 44 is kept from being chipped, at least one substrate 50 having a predetermined thickness can be stably sliced from the second layer 40 in the slicing step S400.

Other Embodiments

Embodiments of the present disclosure have been specifically described. However, the present disclosure is not limited to the above-described embodiments, and various modifications can be made without departing from the gist thereof.

In the above-described embodiment, an explanation is given for the case where the sapphire substrate is used as the base substrate 1, but the base substrate 1 need not be the sapphire substrate so long as the base substrate 1 is constituted by a material different from the group III nitride semiconductor. Specifically, the base substrate 1 may be constituted by silicon carbide (SiC).

In the above-described embodiments, an explanation is given for the case where the AlN layer is formed as the buffer layer 2 on the base substrate 1, but the buffer layer 2 does not necessarily have to be constituted by AlN, and may be constituted by, for example, a group III nitride semiconductor such as GaN, indium nitride (InN), indium gallium nitride (InGaN), or aluminum indium gallium nitride (AlInGaN), that is, a group III nitride semiconductor represented by a composition formula of $Al_xIn_yGa_{1-x-y}N$ ($0 \leq x \leq 1$, $0 \leq y \leq 1$, $0 \leq x+y \leq 1$).

In the above-described embodiments, an explanation is given for the case where the GaN layer is formed as the base layer 5 of the template 10, but the base layer 5 of the template 10 does not necessarily have to be constituted by GaN, and may be constituted by, for example, a group III nitride semiconductor such as AlN, AlGaN, InN, InGaN, or AlInGaN, that is, a group III nitride semiconductor represented by a composition formula of $Al_xIn_yGa_{1-x-y}N$ ($0 \leq x \leq 1$, $0 \leq y \leq x+y \leq 1$).

In the above-described embodiments, an explanation is given for the case where the substrate 50 is a GaN free-standing substrate, but the substrate 50 is not limited to the GaN free-standing substrate, and may be, for example, a free-standing substrate constituted by a group III nitride semiconductor such as AlN, AlGaN, InN, InGaN, or AlInGaN, that is, a free-standing substrate constituted by a group III nitride semiconductor represented by a composition formula of $Al_xIn_yGa_{1-x-y}N$ ($0 \leq x \leq 1$, $0 \leq y \leq 1$, $0 \leq x+y\ 1$).

In the above-described embodiments, an explanation is given for the case where the substrate 50 is n-type, but the substrate 50 may be p-type or may have semi-insulating properties. For example, when manufacturing a semiconductor device as a high electron mobility transistor (HEMT) using the substrate 50, the substrate 50 preferably has semi-insulating properties.

In the above-described embodiments, an explanation is given for the case where the steps from the template forming step S100 to the peeling step S380 are successively performed in the same vapor phase growth apparatus 200, but there is no limitation thereto. For example, the following (i) or (ii) may be adopted.

(i) For example, the template forming step S100 and the steps from the first step S200 to the peeling step S380 may be performed in different vapor phase growth apparatuses. In this case, the template forming step S100 and the steps from the first step S200 to the peeling step S380 can be performed in different HVPE apparatuses. Accordingly, the apparatuses can be configured to be suitable for the respective steps. In the case (i), the template forming step 5100 may be performed in a metalorganic vapor phase growth apparatus (MOVPE apparatus), and the steps from the first step S200 to the peeling step S380 may be performed in the above-described vapor phase growth apparatus 200, which is an HVPE apparatus.

(ii) For example, the buffer layer forming step S140 of the template forming step S100 and the steps from the base layer forming step S160 to the peeling step S380 may be performed in different vapor phase growth apparatuses. In this case, the buffer layer forming step S140 and the steps from the base layer forming step 5160 to the peeling step S380 can be performed in different HVPE apparatuses. Accordingly, it is possible to provide the HVPE apparatus for performing the buffer layer forming step S140 with only a gas generator that accommodates Al, and provide the HVPE apparatus for performing the steps from the base layer forming step S160 to the peeling step S380 with only a gas generator that accommodates only Ga melt. That is, the configuration of each apparatus can be simplified. In the case (ii), it is also possible to perform the buffer layer forming step S140 by using a sputtering apparatus, and perform the steps from the base layer forming step S160 to the peeling step S380 by using the above-described vapor phase growth apparatus 200, which is an HVPE apparatus.

In the above-described embodiments, an explanation is given for the case where the growth temperature is mainly adjusted as the first growth condition in the first step S200, but a growth condition other than the growth temperature may be adjusted, or the growth temperature and another growth condition may be adjusted in combination, as the first growth condition so long as the first growth condition satisfies the formula (1).

In the above-described embodiments, an explanation is given for the case where the growth temperature is mainly adjusted as the second growth condition in the second step S300, but a growth condition other than the growth temperature may be adjusted, or the growth temperature and another growth condition may be adjusted in combination, as the second growth condition so long as the second growth condition satisfies the formula (2).

In the above-described embodiments, an explanation is given for the case where the first growth condition is maintained in the inclined interface maintenance step S240 similarly to the inclined interface expansion step S220, but the growth condition in the inclined interface maintenance step S240 may be different from the growth condition in the inclined interface expansion step S220 so long as the growth condition in the inclined interface maintenance step S240 satisfies the first growth condition.

In the above-described embodiments, an explanation is given for the case where the second growth condition is maintained in the main growth step S340 similarly to the c-plane expansion step S320, but the growth condition in the main growth step S340 may be different from the growth condition in the c-plane expansion step S320 so long as the growth condition in the main growth step S340 satisfies the second growth condition.

In the above-described embodiments, an explanation is given for the case where the second crystal layer 6 or the main growth layer 44 is sliced using a wire saw in the slicing step S170 and the slicing step S400, but for example, an outer peripheral blade slicer, an inner peripheral blade slicer, an electric discharge machine, or the like may be used.

EXAMPLES

Hereinafter, various experimental results supporting the effects of the present disclosure will be described. In the following, the "nitride semiconductor substrate" may be simply abbreviated as the "substrate".

(1) Manufacture of Nitride Semiconductor Substrate

Substrates of samples 1 to 4 were prepared under conditions described below. As for samples 1 to 3, the steps from the template forming step to the peeling step were successively performed in the same vapor phase growth apparatus. The buffer layer, the base layer, the first layer, and the second layer were grown using the HYPE method.

[Conditions for preparing the nitride semiconductor substrate of sample 1]
(Base Substrate)
  Material: sapphire
  Diameter: 2 inches
  Thickness: 400 μm
  Low index crystal plane closest to the main surface: c-plane Processing for forming a mask layer or the like was not performed on the main surface.
(Buffer Layer)
  Material: AlN
  Growth temperature: 1,050° C.
  Thickness: 100 nm
(Base Layer)
  Material: GaN
  Growth temperature: 1,050° C.
  VIII ratio:2
  Thickness: 5 μm
(First Layer)
  Material: GaN
  Growth temperature: 1,008° C.
  VIII ratio: 10
  The first growth condition described above satisfies the formula (1).
  Thickness: about 800 μm
(Second Layer)
  Material: GaN
  Growth temperature: 1,050° C.
  VIII ratio: 2
  The second growth condition described above satisfies the formula (2).
  Thickness: 800 μm
(Slicing Condition)
  Thickness of the substrate: 400 μm
  Kerf loss: 200 μm

[Conditions for Preparing the Nitride Semiconductor Substrate of Sample 2]
  Conditions other than the growth temperature of the first layer were the same as those for sample 1.
  Growth temperature of first layer: 1,012° C.

[Conditions for preparing the nitride semiconductor substrate of sample 3]
  Conditions other than the growth temperature of the first layer were the same as those for sample 1.
  Growth temperature of first layer: 1,017° C.

[Conditions for Preparing the Nitride Semiconductor Substrate of Sample 4]
(Base substrate)
  The same as sample 1.
(Buffer Layer)
  The same as sample 1.
(Crystal Layer)
  The first layer was not formed.
  Growth conditions were the same as those for the second layer of sample 1.
  Thickness: 1,600 μm (2) Evaluation
Observation Using Fluorescence Microscope
  In samples 1 to 3, a cross section of the peeled second layer and cross sections of the base substrate and the remaining layer that were left were observed using a fluorescence microscope.

Observation Using Multiphoton Excitation Microscope
  Main surfaces of the substrates of samples 1 to 3 were observed using a multiphoton excitation microscope. At this time, the dislocation density was measured by measuring a dark spot density over the entire main surface for every 250 μm field of view. It was confirmed that all dark spots on these substrates were dislocations by performing the measurement while shifting a focus in the thickness direction.

X-ray Rocking Curve Measurement
  An X-ray rocking curve of the (0002) plane of the substrate of sample 2 was measured. At this time, the measurement was performed at a plurality of measurement points that were set at 5 mm intervals in each of the m-axis direction and the a-axis direction in the main surface of the substrate. As a result of the measurement, the radius of curvature of the c-plane was obtained based on the diffraction peak angle of the (0002) plane at each measurement point. Further, the full width at half maximum of the (0002) plane diffraction was obtained at each measurement point.

For the measurement, "X'Pert-PRO MRD" manufactured by Spectris was used, and "Hybrid monochromator" manufactured by the same company was used as the monochromator at the incident side. The hybrid monochromator includes an X-ray mirror and two crystals of the Ge (220) plane in this order from an X-ray light source side. When a full width at half maximum is determined through simulation for a case where the rocking curve of the (0002) plane of a perfect crystal GaN is measured using the hybrid monochromator, the full width at half maximum is 25.7 arcsec. That is, this full width at half maximum is the theoretical measurement limit when measurement is performed using the above-described optical system.

The measurement was performed by setting the width of an incident side slit in the ω direction to 0.1 mm. On the other hand, the light receiving side was open. A window width of a detector on the light receiving side was 14.025 mm. In the above-described optical system, the goniometer radius was 420 mm, and therefore, fluctuation of the Bragg angle of ±0.95° could be measured.

(3) Result
Sample 4

In sample 4, when the state was checked after the temperature had been reduced to room temperature after the crystal layer was grown, fine cracks were observed in both the base substrate and the crystal layer. Also, abnormal crystal growth was observed at cross sections at which the crystal layer cracked. From these, it is thought that the base substrate and the crystal layer cracked while the crystal layer was grown. In sample 4, the crystal layer could not be peeled off from the base substrate, and therefore, a substrate was not manufactured.

Samples 1 to 3

In each of samples 1 to 3, when the state was checked after the temperature had been reduced to room temperature after the second layer was grown, an epilayer was observed peeling away from the base substrate. Also, cracks were observed in the remaining base substrate and the peeled epilayer. When a cross section at which the peeled epilayer cracked was observed, abnormal crystal growth from the cross section was not found. From this, it was confirmed that peeling of the epilayer from the base substrate and cracking of the base substrate and the epilayer did not occur until the growth of the second layer ended (when the temperature was high). Also, it was confirmed that the epilayer spontaneously peeled away from the base substrate when the temperature decreased from the growth temperature of the second layer after the second step.

The main surface of the substrate obtained from a split piece had an area of 100 mm² or more.

Figure 13:
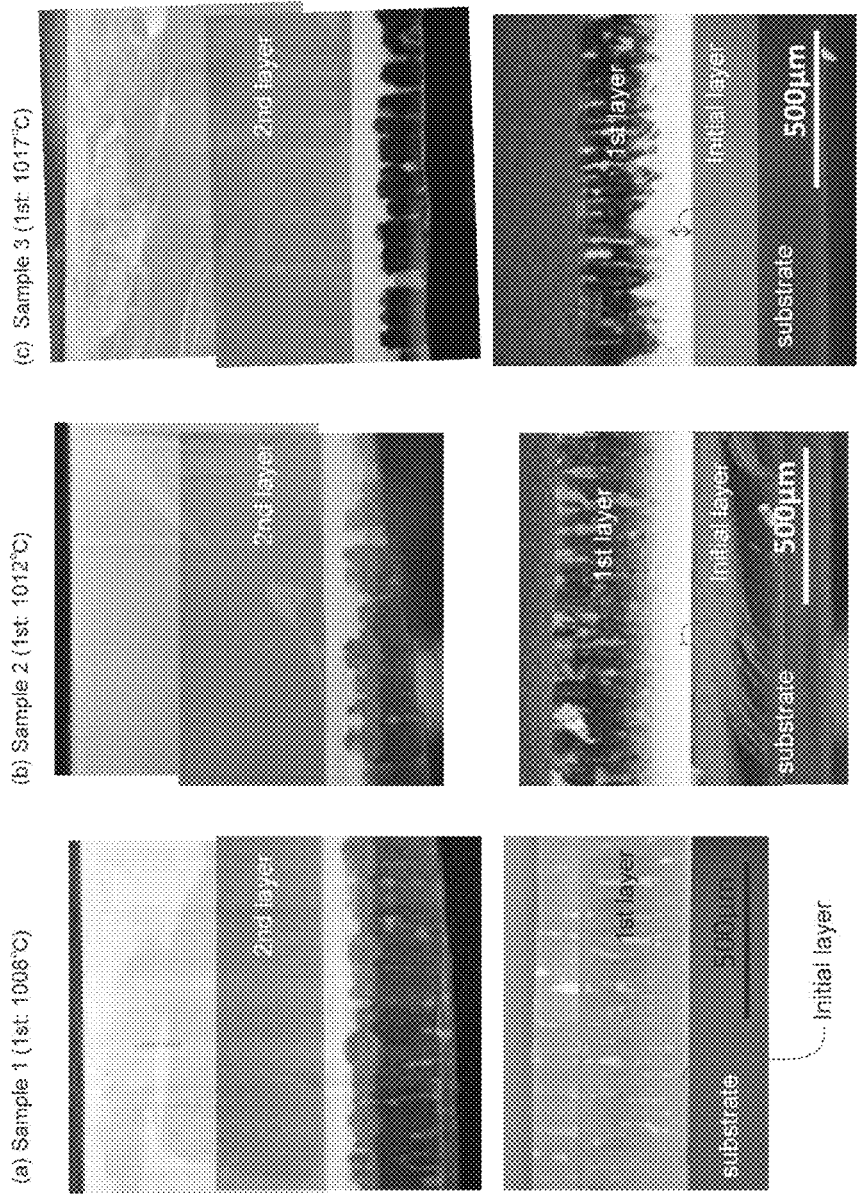
FIGS. 13(a) to 13(c) are diagrams showing observation images obtained by observing cross sections of a peeled second layer and a laminated structure that was left on a base substrate side in samples 1 to 3, respectively, by using a fluorescence microscope.

Next, cross sections of laminated structures of samples 1 to 3 will be described using FIG. 13. FIGS. 13(a) to 13(c) are diagrams showing observation images obtained by observing cross sections of the peeled second layer and the laminated structure that was left on the base substrate side in samples 1 to 3, respectively.

As shown in FIGS. 13(a) to 13(c), in each of samples 1 to 3, the first layer included the first c-plane growth region grown with the c-plane serving as a growth surface and the inclined interface growth region grown with inclined interfaces serving as growth surfaces, based on a difference in growth surfaces during the growth process (i.e., difference in the oxygen concentration). The first c-plane growth region is the bright region and the inclined interface growth region is the dark region.

The first c-plane growth region included a portion corresponding to the initial layer grown with the c-plane serving as a growth surface on the base substrate in the initial stage of the growth of the first layer. The initial layer was formed with a predetermined thickness over the entire main surface of the base substrate.

In samples 1 to 3, the thickness of the initial layer increased as the growth temperature of the first layer increased. It was confirmed that the timing at which three-dimensional growth of the first layer starts depends on the growth temperature. In all of samples 1 to 3, the thickness of the initial layer was no greater than 100 μm.

The inclined interface growth region was formed continuously along the main surface of the base substrate.

An average distance between closest peaks of the first layer, which was estimated based on an average distance between closest valleys on the upper side of the inclined interface growth region, was 66.3 μm, 76.9 μm, and 77.8 μm in samples 1 to 3, respectively.

In each of samples 1 to 3, the second layer peeled away from a peeling surface that included the inclined interface growth region. It was confirmed that, accordingly, the main growth layer of the second layer could be peeled off without being chipped.

Next, dislocations in the main surfaces of the substrates of samples 1 to 3 will be described using FIG. 14. FIGS. 14(a) to 14(c) are diagrams showing observation images obtained by observing the main surfaces of the nitride semiconductor substrates of samples 1 to 3, respectively, by using a multiphoton excitation microscope.

As shown in FIGS. 14(a) to 14(c), when the dislocation density was determined from a dark spot density by observing the main surface of the substrate of each of samples 1 to 3 using the multiphoton excitation microscope in a field of view of 250 μm square, the dislocation density was no greater than $5 \times 10^6$ cm$^{-2}$. When the entire main surface of the substrate of each of samples 1 to 3 was observed for every 250 μm field of view, samples 1 to 3 did not include a region that had a dislocation density higher than $5 \times 10^6$ cm$^{-2}$.

For reference, the dislocation density in a main surface of an epilayer of a conventional template was higher than $5 \times 10^6$ cm$^{-2}$. From this, it was confirmed that the dislocation density in the main surface of the substrate of each of samples 1 to 3 was lower than the dislocation density in the main surface of the epilayer of the conventional template. Also, the dislocation density in a main surface of a substrate manufactured using the VAS method is typically about $3 \times 10^6$ cm$^{-2}$. From this, it was confirmed that the dislocation density in the main surface of the substrate of each of samples 1 to 3 was equivalent to the dislocation density in the main surface of the substrate manufactured using the VAS method.

Also, as shown in FIGS. 14(a) to 14(c), the main surface of the substrate of each of samples 1 to 3 included a plurality of dislocation arrays each constituted by at least three dislocations arranged at intervals of 1 μm or less along a predetermined direction. Based on crystal orientation of the orientation flat of the base substrate before cracking, it was confirmed that in each of samples 1 to 3, 90% or more of all the dislocation arrays were paraxial dislocation arrays extending along a direction forming an angle of 10° or less with respect to the a-axis direction or the m-axis direction.

The number of dislocation arrays was the largest in sample 3 out of samples 1 to 3. Even in sample 3, the density of dislocation arrays in the main surface of the substrate was $7.8 \times 10^4$ arrays/cm$^2$. That is, it was confirmed that in samples 1 to 3, the density of dislocation arrays in the main surface of the substrate was no greater than $1 \times 10^5$ arrays/cm$^2$.

Also, in samples 1 to 3, the length of the longest paraxial dislocation array was about 31 µm. That is, it was confirmed that lengths of paraxial dislocation arrays in the main surface of the nitride semiconductor substrate of each of samples 1 to 3 were no greater than 100 µm.

Figure 15A:
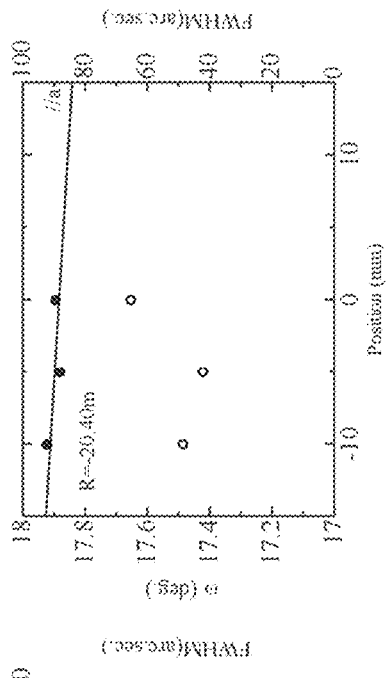
FIG. 15(a) is a diagram showing a result of measuring an X-ray rocking curve of (0002) plane diffraction for a nitride semiconductor substrate of sample 2 along an m-axis direction.
Figure 15B:
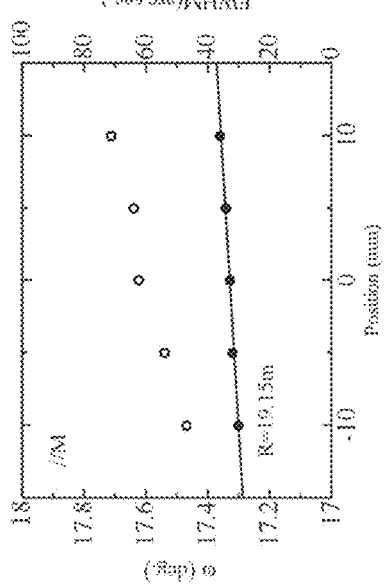
FIG. 15(b) is a diagram showing a result of measuring an X-ray rocking curve of (0002) plane diffraction for the nitride semiconductor substrate of sample 2 along an a-axis direction.
Figure 15C:
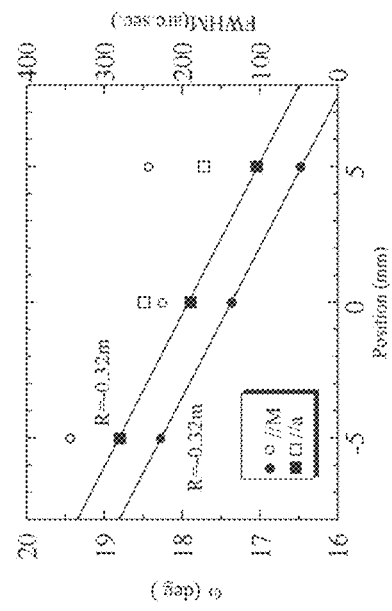
FIG. 15(c) is a diagram showing a result of measuring an X-ray rocking curve of (0002) plane diffraction for a remaining layer of sample 2.

Next, results of the X-ray rocking curve measurement performed on the substrate of sample 2 will be described using FIG. 15. FIG. 15(a) is a diagram showing a result of measuring an X-ray rocking curve of (0002) plane diffraction for the nitride semiconductor substrate of sample 2 along the m-axis direction, FIG. 15(b) is a diagram showing a result of measuring an X-ray rocking curve of (0002) plane diffraction for the nitride semiconductor substrate of sample 2 along the a-axis direction, and FIG. 15(c) is a diagram showing a result of measuring an X-ray rocking curve of (0002) plane diffraction for the remaining layer of sample 2. Black symbol marks indicate peak angles ω and outlined symbol marks indicate FWHM. In the diagrams, the radius of curvature R is expressed as a plus value in a case where the c-plane was concave with respect to the surface, and is expressed as a minus value in a case where the c-plane was convex with respect to the surface.

In sample 2, the laminated structure left on the base substrate side was convex toward the remaining layer side due to a linear expansion coefficient difference between the base substrate and the remaining layer. Therefore, as shown in FIG. 15(c), the radius of curvature of the c-plane of the remaining layer of sample 2 was less than 1 m.

Also, when the X-ray rocking curve of (0002) plane diffraction was measured for the remaining layer of sample 2, the full width at half maximum (FWHM) was greater than 150 arcsec.

In contrast, the substrate obtained from the peeled second layer of sample 2 was not warped. Therefore, as shown in FIGS. 15(a) and 15(b), the absolute value of the radius of curvature of the c-plane of the nitride semiconductor substrate of sample 2 was larger than the absolute value of the radius of curvature of the c-plane of the remaining layer of sample 2, and was 19 m or more.

Also, when the X-ray rocking curve of (0002) plane diffraction was measured for the substrate of sample 2, the full width at half maximum (FWHM) was no greater than 80 arcsec.

It was confirmed that results of X-ray rocking curve measurement performed on samples 1 and 3 were similar to the results of sample 2, although the results of samples 1 and 3 are not shown.

SUMMARY

According to samples 1 to 3 described above, it was confirmed that, even when the second layer was grown on the first layer to be thick enough to stably obtain a substrate, generation of cracks in the epilayer could be suppressed during growth of the second layer as a result of the first layer being three-dimensionally grown on the template in the first step after the template forming step. That is, it was confirmed that the structure of the three-dimensionally grown first layer had an effect of mitigating stress (strain).

Also, in samples 1 to 3, as a result of inclined interfaces other than the c-plane being generated in the surface of the first layer in the first step, dislocations were bent at positions at which the inclined interfaces were exposed, and propagated. It was confirmed that as a result, the dislocation density could be lowered in the main surface of the substrate obtained from the peeled second layer.

Also, in samples 1 to 3, the second layer spontaneously peeled away from the base substrate 1 while the temperature decreased from the growth temperature of the second layer. It was confirmed that as a result, a substrate of which the dislocation density was reduced and that had good crystal quality could be easily obtained.

Also, in samples 1 to 3, the base layer having the mirror-finished base surface was formed over the entire main surface of the base substrate in the template forming step. Also, in the first step, the initial layer having the mirror-finished surface was formed with a predetermined thickness before the first layer started to three-dimensionally grow. For these reasons, it was possible to make the inclined interfaces uniformly appear in a plane of the first layer in the first step. It was confirmed that as a result, the dislocation density could be lowered over the entire main surface of the substrate obtained from the second layer.

Also, in samples 1 to 3, the first layer was three-dimensionally grown after the initial layer was two-dimensionally grown with the c-plane serving as a growth surface so as to have the predetermined thickness in the initial stage of the first step.

As a result, the crystal axis was made uniform over the entire main surface of the base substrate, and generation of new dislocations due to misalignment between crystal axes could be suppressed. It was confirmed that as a result, it was possible to lower the dislocation density and the density of dislocation arrays, and reduce the length of each dislocation array.

Also, in samples 1 to 3, the inclined interface growth region was formed with a predetermined thickness continuously along the main surface of the base substrate. That is, it was confirmed that the c-plane disappeared from the top surface of the first layer in the first step. It was confirmed that as a result, formation of a high dislocation density region was suppressed in the main surface of the substrate obtained from the second layer, and the dislocation density could be lowered over the entire main surface.

Also, in samples 1 to 3, as a result of the second layer spontaneously peeling away from the base substrate, warpage of the second layer was suppressed and stress was released from the peeled second layer. It was confirmed that as a result, the c-plane of the peeled second layer had a radius of curvature of 5 m or more, which was larger than the absolute value of the radius of curvature of the c-plane of the remaining layer.

Also, in samples 1 to 3, the number of dislocations was small and the crystal quality factors of the substrate were good over a wide range of the main surface of the substrate, as described above. It was confirmed that as a result, the full width at half maximum determined through the X-ray rocking curve measurement of (0002) plane diffraction was no greater than 100 arcsec over a wide range of the main surface of the substrate of each of samples 1 to 3.

<Preferable Aspects of the Present Disclosure>

Hereinafter, preferable aspects of the present disclosure will be supplementarily described.

Supplementary Note 1

A method for manufacturing a nitride semiconductor substrate by using a vapor phase growth method, including:

a step of preparing a base substrate constituted by a material different from a single crystal of a group III nitride semiconductor;

a step of growing a base layer that has a mirror-finished base surface and in which a low index crystal plane closest to the base surface is a (0001) plane, by epitaxially growing a single crystal of a group III nitride semiconductor on the upper side of the base substrate;

a first step of growing a first layer by epitaxially growing a single crystal of a group III nitride semiconductor directly on the base surface of the base layer, the single crystal of the group III nitride semiconductor having a top surface at which a (0001) plane is exposed, a plurality of recessed portions formed by inclined interfaces other than the (0001) plane being generated in the top surface, the inclined interfaces being gradually expanded toward an upper side of the base surface of the base layer to make the (0001) plane disappear from the top surface, and a surface of the first layer being constituted only by the inclined interfaces; and a second step of growing a second layer that has a mirror-finished surface by epitaxially growing a single crystal of a group III nitride semiconductor on the first layer so as to make the inclined interfaces disappear, wherein, in the first step, the plurality of recessed portions are generated in the top surface of the single crystal after the single crystal is grown so as to have a predetermined thickness with the (0001) plane serving as a growth surface.

Supplementary Note 2

The method for manufacturing a nitride semiconductor substrate according to Supplementary Note 1, wherein, in the step of preparing the base substrate, a substrate constituted by a single crystal that is represented by a composition formula $RAO_3(MO)_n$ is prepared as the base substrate, R representing a trivalent element that is at least any one of Sc, In, Y, and a lanthanoid series element, A representing a trivalent element that is at least any one of Fe(III), Ga, and Al, M representing a divalent element that is at least any one of Mg, Mn, Fe(II), Co, Cu, Zn, and Cd, and n representing an integer greater than or equal to 1.

Supplementary Note 3

The method for manufacturing a nitride semiconductor substrate according to Supplementary Note 2, further including a peeling step of peeling off a laminated structure from a portion of the base substrate below a cleavage surface after the second step by cleaving the base substrate along a (0001) plane of the base substrate that serves as the cleavage surface extending along a main surface of the base substrate, the laminated structure including a portion of the base substrate above the cleavage surface, the base layer, the first layer, and the second layer.

Supplementary Note 4

The method for manufacturing a nitride semiconductor substrate according to Supplementary Note 3, further including a step of slicing the second layer peeled off in the peeling step to form at least one nitride semiconductor substrate, wherein, in the step of slicing the second layer, the (0001) plane of the nitride semiconductor substrate has a radius of curvature of 5 m or more.

Supplementary Note 5

The method for manufacturing a nitride semiconductor substrate according to Supplementary Note 1, further including a peeling step in which at least the second layer spontaneously peels away from the base substrate while the temperature decreases from a growth temperature of the second layer after the second step, due to a difference between a linear expansion coefficient of the base substrate and linear expansion coefficients of layers above the base substrate.

Supplementary Note 6

The method for manufacturing a nitride semiconductor substrate according to Supplementary Note 5, wherein the (0001) plane of the second layer peeled off in the peeling step has a radius of curvature of 5 m or more.

Supplementary Note 7

The method for manufacturing a nitride semiconductor substrate according to Supplementary Note 5 or 6, wherein, in the peeling step, at least the second layer peels away from a peeling surface that includes a region of the first layer that has grown with the inclined interfaces serving as growth surfaces.

Supplementary Note 8

The method for manufacturing a nitride semiconductor substrate according to any one of Supplementary Notes 1 to 7, wherein, in the first step, after the (0001) plane disappears from the surface, growth of the first layer is continued over a predetermined thickness while a state where the surface is constituted only by the inclined interfaces is maintained.

Supplementary Note 9

The method for manufacturing a nitride semiconductor substrate according to any one of Supplementary Notes 1 to 8, wherein a template is used in the first step, the template including the base substrate and the base layer, and being in a state where none of patterning processing of a formation of a mask layer on the base surface and patterning processing of a formation of an uneven pattern on the base substrate or the base surface is performed.

Supplementary Note 10

The method for manufacturing a nitride semiconductor substrate according to any one of Supplementary Notes 1 to 9, wherein, in the first step, {11-2m} planes that satisfy m≥3 are generated as the inclined interfaces.

Supplementary Note 11

The method for manufacturing a nitride semiconductor substrate according to any one of Supplementary Notes 1 to 10, wherein, in the first step, the first layer is grown under a first growth condition that satisfies formula (1), and in the second step, the second layer is grown under a second growth condition that satisfies formula (2), $$G_{c1} > G_i / \cos \alpha \quad (1)$$

$$G_{c2} \leq G_i / \cos \alpha \quad (2)$$

wherein $G_{c1}$ represents a growth rate of the (0001) plane in the first layer, $G_{c2}$ represents a growth rate of the (0001) plane in the second layer, $G_i$ represents a growth rate of an inclined interface in each of the first layer and the second layer, the inclined interface being the most inclined with respect to the (0001) plane among the inclined interfaces, and a represents an angle formed by the (0001) plane and the inclined interface most inclined with respect to the (0001) plane in each of the first layer and the second layer.

Supplementary Note 12

The method for manufacturing a nitride semiconductor substrate according to any one of Supplementary Notes 1 to 11,
wherein a growth temperature in the first step is 980° C. or higher.

Supplementary Note 12

The method for manufacturing a nitride semiconductor substrate according to any one of Supplementary Notes 1 to 11,
wherein, in the first step, two-dimensional growth in which the (0001) plane serves as a growth surface transitions to three-dimensional growth in which the inclined interfaces serve as growth surfaces, under the same growth condition.

Supplementary Note 13

The method for manufacturing a nitride semiconductor substrate according to any one of Supplementary Notes 1 to 12,
wherein, in the first step,
a plurality of valleys and a plurality of peaks are formed in the surface of the first layer as a result of the plurality of recessed portions being generated in the top surface of the single crystal and the (0001) plane disappearing, and
when an arbitrary cross section that is perpendicular to a main surface of the base substrate is observed, an average distance between a pair of peaks spaced apart from each other in a direction extending along the main surface is 1 μm or more, the pair of peaks being closest to each other among the plurality of peaks with one of the plurality of valleys sandwiched therebetween.

Supplementary Note 14

The method for manufacturing a nitride semiconductor substrate according to any one of Supplementary Notes 1 to 13,
wherein the steps from the step of growing the base layer to the second step are successively performed in the same vapor phase growth apparatus.

Supplementary Note 15

The method for manufacturing a nitride semiconductor substrate according to Supplementary Note 14, further including
a step of forming a buffer layer constituted by a group III nitride semiconductor on the base substrate, between the step of preparing the base substrate and the step of forming the base layer, and
the steps from the step of forming the buffer layer to the peeling step are successively performed in the same vapor phase growth apparatus.

Supplementary Note 16

The method for manufacturing a nitride semiconductor substrate according to any one of Supplementary Notes 1 to 13, further including
a step of forming a buffer layer constituted by a group III nitride semiconductor on the base substrate, between the step of preparing the base substrate and the step of forming the base layer, and
in the step of forming the buffer layer, the buffer layer is formed by sputtering.

Supplementary Note 17

A nitride semiconductor substrate that is constituted by a crystal of a group III nitride semiconductor and includes a main surface for which the closest low index crystal plane is a (0001) plane,
wherein, when dislocations are detected based on dark spots by observing the main surface using a multiphoton excitation microscope in a field of view of 250 μm square,
the main surface does not include a region that has a dislocation density higher than $5\times10^6$ cm$^{-2}$,
the main surface includes a plurality of dislocation arrays each constituted by at least three dislocations that are arranged at intervals of 1 p.m or less along a predetermined direction,
the plurality of dislocation arrays include paraxial dislocation arrays each extending along a direction that forms an angle of 10° or less with respect to a <11-20> axis direction or a <1-100> axis direction, and
the density of the plurality of dislocation arrays in the main surface is $1\times10^6$ arrays/cm$^2$ or less.

Supplementary Note 18

The nitride semiconductor substrate according to Supplementary Note 17, wherein the paraxial dislocation arrays each have an array length of 100 μm or less.

Supplementary Note 19

A nitride semiconductor substrate that is constituted by a crystal of a group III nitride semiconductor and includes a main surface for which the closest low index crystal plane is a (0001) plane,
wherein, when dislocations are detected based on dark spots by observing the main surface using a multiphoton excitation microscope in a field of view of 250 μm square,
the main surface does not include a region that has a dislocation density higher than $5\times10^6$ cm−2,
the main surface includes a plurality of dislocation arrays each constituted by at least three dislocations that are arranged at intervals of 1 μm or less along a predetermined direction,
the plurality of dislocation arrays include paraxial dislocation arrays each extending along a direction that forms an angle of 10° or less with respect to a <11-20> axis direction or a <1-100> axis direction, and
the paraxial dislocation arrays each have an array length of 100 μm or less.

Supplementary Note 20

The nitride semiconductor substrate according to any one of Supplementary Notes 17 to 19,
wherein the (0001) plane has a radius of curvature of 5 m or more.

Supplementary Note 21

The nitride semiconductor substrate according to any one of Supplementary Notes 17 to 20,
wherein a full width at half maximum determined through X-ray rocking curve measurement of (0002) plane diffraction is 100 arcsec or less.

REFERENCE SIGNS LIST

1 Base substrate
2 Buffer layer
5 Base layer
10 Template
30 First layer
40 Second layer
50 Nitride semiconductor substrate (substrate)

The invention claimed is:
1. A method for manufacturing a nitride semiconductor substrate by using a vapor phase growth method, comprising:

a step of preparing a base substrate that is constituted by a material different from a single crystal of a group III nitride semiconductor;

a step of growing a base layer that has a mirror-finished base surface and in which a low index crystal plane closest to the base surface is a (0001) plane, by epitaxially growing a single crystal of a group III nitride semiconductor on the upper side of the base substrate;

a first step of growing a first layer by epitaxially growing a single crystal of a group III nitride semiconductor directly on the base surface of the base layer, the single crystal of the group III nitride semiconductor having a top surface at which a (0001) plane is exposed, a plurality of recessed portions formed by inclined interfaces other than the (0001) plane being generated in the top surface, the inclined interfaces being gradually expanded toward an upper side of the base surface of the base layer to make the (0001) plane disappear from the top surface, and a surface of the first layer being constituted only by the inclined interfaces; and a second step of growing a second layer that has a mirror-finished surface by epitaxially growing a single crystal of a group III nitride semiconductor on the first layer so as to make the inclined interfaces disappear, wherein, in the first step, the plurality of recessed portions are generated in the top surface of the single crystal after the single crystal is grown so as to have a predetermined thickness with the (0001) plane serving as a growth surface.

2. The method for manufacturing a nitride semiconductor substrate according to claim 1,
wherein, in the step of preparing the base substrate, a substrate constituted by a single crystal that is represented by a composition formula $RAO_3 (MO)_n$ is prepared as the base substrate, R representing a trivalent element that is at least any one of Sc, In, Y, and a lanthanoid series element, A representing a trivalent element that is at least any one of Fe(III), Ga, and Al, M representing a divalent element that is at least any one of Mg, Mn, Fe(II), Co, Cu, Zn, and Cd, and n representing an integer greater than or equal to 1.

3. The method for manufacturing a nitride semiconductor substrate according to claim 2, further comprising
a peeling step of peeling off a laminated structure from a portion of the base substrate below a cleavage surface after the second step by cleaving the base substrate along a (0001) plane of the base substrate that serves as the cleavage surface extending along a main surface of the base substrate, the laminated structure including a portion of the base substrate above the cleavage surface, the base layer, the first layer, and the second layer.

4. The method for manufacturing a nitride semiconductor substrate according to claim 1, further comprising
a peeling step in which at least the second layer spontaneously peels away from the base substrate while the temperature decreases from a growth temperature of the second layer after the second step, due to a difference between a linear expansion coefficient of the base substrate and linear expansion coefficients of layers above the base substrate.

5. The method for manufacturing a nitride semiconductor substrate according to claim 1,
wherein, in the first step, after the (0001) plane disappears from the surface, growth of the first layer is continued over a predetermined thickness while a state where the surface is constituted only by the inclined interfaces is maintained.

6. The method for manufacturing a nitride semiconductor substrate according to claim 1,
wherein a template is used in the first step, the template including the base substrate and the base layer, and being in a state where none of patterning processing of a formation of a mask layer on the base surface and patterning processing of a formation of an uneven pattern on the base substrate or the base surface is performed.

7. The method for manufacturing a nitride semiconductor substrate according to claim 1,
wherein a growth temperature in the first step is 980° C. or higher.

8. The method for manufacturing a nitride semiconductor substrate according to claim 1,
wherein, in the first step, two-dimensional growth in which the (0001) plane serves as a growth surface transitions to three-dimensional growth in which the inclined interfaces serve as growth surfaces, under the same growth condition.

9. The method for manufacturing a nitride semiconductor substrate according claim 1,
wherein, in the first step,
a plurality of valleys and a plurality of peaks are formed in the surface of the first layer as a result of the plurality of recessed portions being generated in the top surface of the single crystal and the (0001) plane disappearing, and
when an arbitrary cross section that is perpendicular to a main surface of the base substrate is observed, an average distance between a pair of peaks spaced apart from each other in a direction extending along the main surface is 1 μm or more, the pair of peaks being closest to each other among the plurality of peaks with one of the plurality of valleys sandwiched therebetween.

10. The method for manufacturing a nitride semiconductor substrate according to claim 1,
wherein the steps from the step of growing the base layer to the second step are successively performed in the same vapor phase growth apparatus.

11. A nitride semiconductor substrate that is constituted by a crystal of a group III nitride semiconductor and includes a main surface for which the closest low index crystal plane is a (0001) plane,
wherein, when dislocations are detected based on dark spots by observing the main surface using a multiphoton excitation microscope in a field of view of 250 μm square,
the main surface does not include a region that has a dislocation density higher than $5 \times 10^6$ cm$^{-2}$,
the main surface includes a plurality of dislocation arrays each constituted by at least three dislocations that are arranged at intervals of 1 μm or less along a predetermined direction,
the plurality of dislocation arrays include paraxial dislocation arrays each extending along a direction that forms an angle of 10° or less with respect to a <11-20> axis direction or a <1-100> axis direction, and
the density of the plurality of dislocation arrays in the main surface is $1 \times 10^6$ arrays/cm$^2$ or less.

12. The nitride semiconductor substrate according to claim 11,
wherein the paraxial dislocation arrays each have an array length of 100 μm or less.

13. A nitride semiconductor substrate that is constituted by a crystal of a group III nitride semiconductor and includes a main surface for which the closest low index crystal plane is a (0001) plane, wherein, when dislocations are detected based on dark spots by observing the main surface using a multiphoton excitation microscope in a field of view of 250 μm square, the main surface does not include a region that has a dislocation density higher than $5 \times 10^6$ cm$^{-2}$, the main surface includes a plurality of dislocation arrays each constituted by at least three dislocations that are arranged at intervals of 1 μm or less along a predetermined direction, the plurality of dislocation arrays include paraxial dislocation arrays each extending along a direction that forms an angle of 10° or less with respect to a <11-20> axis direction or a <1-100> axis direction, and the paraxial dislocation arrays each have an array length of 100 μm or less.

14. The nitride semiconductor substrate according to claim 11, wherein the (0001) plane has a radius of curvature of 5 m or more.

15. The nitride semiconductor substrate according to claim 11, wherein a full width at half maximum determined through X-ray rocking curve measurement of (0002) plane diffraction is 100 arcsec or less.

\* \* \* \* \*